United States Patent
Fukami et al.

(10) Patent No.: US 8,884,388 B2
(45) Date of Patent: Nov. 11, 2014

(54) MAGNETIC MEMORY ELEMENT, MAGNETIC MEMORY AND MANUFACTURING METHOD OF MAGNETIC MEMORY

(75) Inventors: Shunsuke Fukami, Tokyo (JP); Kiyokazu Nagahara, Tokyo (JP); Tetsuhiro Suzuki, Tokyo (JP)

(73) Assignee: NEC Corporation, Tokyo (JP)

( * ) Notice: Subject to any disclaimer, the term of this patent is extended or adjusted under 35 U.S.C. 154(b) by 108 days.

(21) Appl. No.: 13/636,280

(22) PCT Filed: Mar. 9, 2011

(86) PCT No.: PCT/JP2011/055552
§ 371 (c)(1),
(2), (4) Date: Nov. 30, 2012

(87) PCT Pub. No.: WO2011/118395
PCT Pub. Date: Sep. 29, 2011

(65) Prior Publication Data
US 2013/0113058 A1 May 9, 2013

(30) Foreign Application Priority Data
Mar. 23, 2010 (JP) .................. 2010-066862

(51) Int. Cl.
*H01L 29/82* (2006.01)
*H01L 43/08* (2006.01)
*H01L 43/12* (2006.01)
*G11C 11/16* (2006.01)
*H01L 43/02* (2006.01)
*H01L 27/22* (2006.01)

(52) U.S. Cl.
CPC ............... *H01L 43/02* (2013.01); *H01L 27/228* (2013.01); *H01L 43/08* (2013.01); *H01L 43/12* (2013.01); *G11C 11/161* (2013.01)

USPC ........... 257/421; 257/422; 257/423; 257/427; 257/E29.323; 438/3

(58) Field of Classification Search
CPC ....................................................... H01L 43/08
USPC ......... 257/20, 414, 421–427, E29.323; 438/3
See application file for complete search history.

(56) References Cited

U.S. PATENT DOCUMENTS

| 8,174,086 B2 | 5/2012 | Fukami et al. |
| 2008/0137405 A1 | 6/2008 | Ohno et al. |

(Continued)

FOREIGN PATENT DOCUMENTS

| JP | 2005-150303 A | 6/2005 |
| JP | 2005-191032 A | 7/2005 |

(Continued)

OTHER PUBLICATIONS

Noboru Sakimura et al., MRAM cell Technology for Over 500-MHz SoC, IEEE Journal of Solid-State Circuits, Apr. 2007, pp. 830-838, vol. 42, No. 4.

(Continued)

*Primary Examiner* — Jami M Valentine
(74) *Attorney, Agent, or Firm* — Foley & Lardner LLP

(57) ABSTRACT

A magnetic memory element includes: a first magnetization free layer configured to be composed of ferromagnetic material with perpendicular magnetic anisotropy; a reference layer configured to be provided near the first magnetization free layer; a non-magnetic layer configured to be provided adjacent to the reference layer; and a step formation layer configured to be provided under the first magnetization free layer. The first magnetization free layer includes: a first magnetization fixed region of which magnetization is fixed, a second magnetization fixed region of which magnetization is fixed, and a magnetization free region configured to be connected with the first magnetization fixed region and the second magnetization fixed region. The first magnetization free layer has at least one of a step, a groove and a protrusion inside.

15 Claims, 23 Drawing Sheets

(56) References Cited

U.S. PATENT DOCUMENTS

| | | | |
|---|---|---|---|
| 2010/0188890 A1* | 7/2010 | Fukami et al. | 365/158 |
| 2011/0199818 A1* | 8/2011 | Fukami et al. | 365/171 |

FOREIGN PATENT DOCUMENTS

| | | |
|---|---|---|
| JP | 2006-270069 A | 10/2006 |
| JP | 2007-103663 A | 4/2007 |
| JP | 2007-324172 A | 12/2007 |
| JP | 2009-130197 A | 6/2009 |
| JP | 2009-252909 A | 10/2009 |
| WO | WO 2005/069368 A1 | 7/2005 |
| WO | WO 2007/119748 A1 | 10/2007 |
| WO | WO 2009/001706 A1 | 12/2008 |
| WO | WO 2009/060749 A1 | 5/2009 |

OTHER PUBLICATIONS

Yamaguchi et al., Real-Space Observation of Current-Driven Domain Wall Motion in Submicron Magnetic Wires, Physical Review Letters, The American Physical Society, 2004, pp. 077205-1-077205-4, vol. 92, No. 7.

S. Fukami et al., Micromagnetic Analysis of Current Driven Domain Wall Motion in Nanostrips with Perpendicular Magnetic Anisotropy, Journal of Applied Physics, 2008, pp. 07E718-1-07E718-3, vol. 103.

Tomohiro Koyama et al., Control of Domain Wall Position by Electrical Current in Structured Co/Ni Wire with Perpendicular Magnetic Anisotropy, Applied Physics Express, The Japan Society of Applied Physics, 2008, pp. 101303-1-101303-3, vol. 1.

* cited by examiner

MAGNETIC MEMORY ELEMENT, MAGNETIC MEMORY AND MANUFACTURING METHOD OF MAGNETIC MEMORY

This application is the National Phase of PCT/JP2011/055552, filed Mar. 9, 2011, which claims priority to Japanese Application No. 2010-66862, filed Mar. 23, 2010, the disclosures of which are hereby incorporated by reference in their entirety.

TECHNICAL FIELD

The present invention relates to a magnetic memory element, a magnetic memory and a manufacturing method of the same. Particularly, the present invention relates to a magnetic memory element, a magnetic memory and a manufacturing method of the same, to which domain wall motion is applied.

BACKGROUND ART

A magnetic memory or a magnetic random access memory (MRAM) is a nonvolatile memory capable of a high-speed operation and rewriting an infinite number of times. Therefore, some types of MRAMs have been put into practical use, and some types of MRAMs have been developing to improve their general versatility. In the MRAM, magnetic material is used for a memory element, and data is stored in the memory element as a magnetization direction of the magnetic material. Some methods for switching the magnetization direction of the magnetic material are proposed. Those methods have in common with usage of a current. To put the MRAM into practical use, it is important to reduce this writing current as much as possible. According to a non-patent literature 1, it is required that the wiring current should be reduced to be equal to or less than 0.5 mA, preferably equal to or less than 0.2 mA. This is because the minimum layout can be applied to the 2T-1MTJ (Two transistors—One Magnetic tunnel junction) circuit configuration proposed in the non-patent literature 1 to realize the cost performance equal to or more than that of the existing volatile memory such as a DRAM and a SRAM and so on.

The most general method of writing data in the MRAM is to switch a magnetization direction of a magnetic memory element by a magnetic field which is generated by passing a current through a wiring line for a writing operation prepared on the periphery of the magnetic memory element. Since this method uses the magnetization switching caused by the magnetic field, the MRAM can theoretically perform the writing at the speed of 1 nano-second or less and thus, the MRAM is suitable for the high-speed MRAM. However, a magnetic field for switching magnetization of a magnetic material securing thermal stability and resistance against external disturbance magnetic field is generally a few dozens of [Oe]. In order to generate such a magnetic field, the writing current of about a few mA is needed. In this case, a chip area is necessarily large and power consumed for the writing increases. Therefore, this MRAM is not competitive with other kinds of random access memories. In addition, when the size of the memory cell is miniaturized, the writing current further increases and is not scaling, which is not preferable.

Recently, as methods to solving these problems, following two methods are proposed. The first method is a method using a spin transfer magnetization switching. This method uses a lamination layer including a first magnetic layer (magnetization free layer) which has magnetization that can be switched, and a second magnetic layer (reference layer) which is electrically connected to the first magnetic layer and has fixed magnetization. In the method, the magnetization in the first magnetic layer (magnetization free layer) is switched by using an interaction between spin-polarized conduction electrons and localized electrons in the first magnetic layer (magnetization free layer) when a current flows between the second magnetic layer (reference layer) and the first magnetic layer (magnetization free layer). A reading operation is carried out by using a magnetoresistive effect generated between the first magnetic layer (magnetization free layer) and the second magnetic layer(reference layer). Therefore, the MRAM using the spin transfer magnetization switching method is an element having two terminals. The spin transfer magnetization switching is generated when a current density is equal to or more than a certain value. Accordingly, as the size of the element decreases, the writing current is also decreased. In other words, the spin transfer magnetization switching method is excellent in scaling performance. However, generally, an insulating film is provided between the first magnetic layer (magnetization free layer) and the second magnetic layer (reference layer) and a relatively large current should be made to flow through the insulating film in the writing operation. Thus, there are problems regarding a writing resistance property to and reliability. In addition, there is concern that a writing error occurs in the reading operation because a current path of the writing operation is the same as that of the reading operation. As mentioned above, although the spin transfer magnetization switching method is excellent in the scaling performance, there are some obstacles to put it into practical use.

On the other hand, the second method, which is a magnetization switching method using a current induced domain wall motion effect, can solve the above-mentioned problems that the spin transfer magnetization switching method is confronted with. For example, a MRAM using the current induced domain wall motion effect is disclosed in a patent literature 1. Regarding the MRAM using the current induced domain wall motion effect, generally, in the first magnetic layer (magnetization free layer) having the magnetization which can be switched, magnetization of both end portions is fixed such that the magnetization of one end portion is approximately anti-parallel to that of the other end portion, and magnetization of the center portion can be switched. In the case of such magnetization arrangement, a domain wall is introduced into any of ends the center portion in the first magnetic layer. Here, as reported in a non-patent literature 2, when a current flows in a direction where the current penetrates the domain wall, the domain wall moves in the direction same as the direction of the conduction electrons in the center portion. Therefore, the data writing can be realized by making the current flow inside the first magnetic layer (magnetization free layer). The data reading is realized by using the magnetoresistive effect caused by a magnetic tunnel junction (MTJ) provided in a region (the center portion) where the domain wall moves. Therefore, the MRAM using the current induced domain wall motion method is an element having three terminals, and fits in the 2T-1MTJ configuration proposed in the above-mentioned non-patent literature 1. The current induced domain wall motion is generated when a current density is equal to or more than a certain value. Thus, this MRAM has the scaling property similar to the MRAM using the spin transfer magnetization switching. In addition, in the MRAM element using the current induced domain wall motion, the writing current does not flow through the insulating layer in the magnetic tunnel junction and the current path of the writing operation is different from that of the reading operation. Consequently, the above-mentioned problems caused in the spin transfer magnetization switching can be solved.

Meanwhile, in the non-patent literature 2, a current density of approximately $1 \times 10^8$ A/cm$^2$ is required for the current induced driven domain wall motion. For example, it is assumed that a width and a thickness of a layer where the domain wall motion arises are 100 nm and 10 nm, respectively. In this case, the writing current is 1 mA. This cannot satisfy the above-described condition for the writing current. However, as described in a non-patent literature 3, it is reported that, by using material having perpendicular magnetic anisotropy for a ferromagnetic layer (magnetization free layer) where the current induced domain wall motion arises, the writing current can be sufficiently reduced. Because of this, in the case of manufacturing the MRAM using the current induced domain wall motion, it is preferable to use ferromagnetic material having perpendicular magnetic anisotropy as a layer (magnetization free layer) where the domain wall motion arises.

As a related art, Japanese patent application publication JP2009-252909A discloses a magnetoresistive effect element and a magnetic random access memory. This magnetoresistive effect element includes a first ferromagnetic layer composed of ferromagnetic material with perpendicular magnetic anisotropy. The first ferromagnetic layer includes a first magnetization fixed region, a second magnetization fixed region and a magnetization free region. The first magnetization fixed region has magnetization fixed in a first direction. The second magnetization fixed region has magnetization fixed in a direction anti-parallel to the first direction. The magnetization free region is connected with the first and second magnetization fixed regions and has magnetization which can be switched. An upper surface of one of the first magnetization fixed region and the magnetization free region is higher than an upper surface of the other in a substrate-perpendicular direction. A lower surface of one of the first magnetization fixed region and the magnetization free region is lower than a lower surface of the other in the substrate-perpendicular direction.

International patent publication WO2005/069368A (corresponding to US patent application publication US 2008/137405(A1) discloses a current injection domain wall motion element. This current injection domain wall motion element has fine junctions of first and second magnetic bodies which have magnetization directions anti-parallel to each other and a third magnetic body sandwiched the first magnetic body and the second magnetic body. By making a current flow across boundaries of the fine junctions, an interaction between the current and a domain wall causes the domain wall to move toward a current direction or a direction opposite to the current direction, thereby controlling a magnetization direction of the element.

Japanese patent application publication JP2006-270069A discloses a magnetoresistive effect element and a high-speed magnetic recording device based on a domain wall motion using a pulse current. This magnetoresistive effect element includes a first magnetization fixed layer/a magnetization free layer/a second magnetization fixed layer. The magnetoresistive effect element includes a mechanism for inducing a domain wall generation in a transition region between the magnetization fixed layer and magnetization free layer, the transition region being at least one of a boundary between the first magnetization fixed layer/the magnetization free layer and a boundary between the magnetization free layer/the second magnetization fixed layer. The magnetization directions of these magnetization fixed layers are set to approximately anti-parallel magnetizations. The domain wall exists one of the transition regions between the first magnetization fixed layer/the magnetization free layer and between the second magnetization fixed layer/the magnetization free layer. By applying a current equal to or less than $10^6$ A/cm$^2$ with a certain pulse width, the domain wall moves between two transition regions, thereby making the magnetization of the magnetization free layer switch and detecting the magnetoresistive value caused by the switching of the relative magnetization direction.

Japanese patent application publication JP 2007-103663A1 discloses a magnetic element, a recoding reproducing element, a logic operational element and a logic operational device. The magnetic element includes a first magnetic layer, a non-magnetic layer and a second magnetic layer. The first magnetic layer includes a magnetization changeable region in which magnetization can be changed to one of a first direction and a second direction anti-parallel to the first direction and a first electrode which introduces a current into itself inside. The non-magnetic layer has contact with the magnetization changeable region of the first magnetic layer at its surface and includes a second electrode which applies a certain potential to itself. The second magnetic layer has contact with a back surface of the non-magnetic layer, has its internal magnetization which is previously fixed in one of first and second directions, and includes a third electrode which detects its potential.

CITATION LIST

Patent Literature

[PTL 1] JP2005-191032A
[PTL 2] JP2009-130197A
[PTL 3] JP2009-252909A
[PTL 4] WO2005/069368A
[PTL 5] JP2006-270069A
[PTL 6] JP2007-103663A

Non Patent Literature

[NPL 1] IEEE Journal of Solid-State Circuits, vol. 42, p. 830 (2007).
[NPL 2] Physical Review Letters, vol. 92, p. 077205 (2004).
[NPL 3] Journal of Applied Physics, vol. 103, p. 07E718 (2008).
[NPL 4] Applied Physics Express, vol. 1, p. 101303 (2008).

SUMMARY OF INVENTION

In a MRAM (a domain wall motion MRAM) to which current induced domain wall motion is applied, information is stored corresponding to a position of a domain wall. Therefore, in order to stably hold information, it is necessary to provide a mechanism in which the domain wall is stably trapped in a certain position during a non-operation time. The patent literature 2 discloses a method using a step as a structure for stably trapping the domain wall in a racetrack memory. Here, it is assumed that a method using this step is the trapping mechanism (a pinning site) for the domain wall of the domain wall motion MRAM (the perpendicular magnetization domain wall motion MRAM) using ferromagnetic material with perpendicular magnetic anisotropy. In this case, a film thickness of a perpendicular magnetization film is approximately several nano-meters, and a domain wall width (a thickness of the domain wall) is approximately 10 nanometers. Therefore, it is preferable that a height of the step is approximately several nano-meters, and a length of the step in a lateral direction (a direction of the thickness of the domain wall) is approximately 10 nano-meters or less. In addition, it is preferable that the height of the step is controllable arbitrarily. When the inventor of the present invention has tried to form the step by using the manufacturing method disclosed in the patent literature 2, it has been found that arbitrary control of the height of the step at the several nano-meter level is very difficult, a taper angle of the step becomes relatively gradual, and the length becomes 10 nano-meters or more. That is, in the recent MRAM in which the miniaturization has been developing, it has been found that it is very difficult for the technique of the patent literature 2 to excellently act as the trapping mechanism of the domain wall from a practical standpoint.

An object of the present invention is to provide, in a magnetic memory element and a magnetic memory (a domain wall motion MRAM) of domain wall motion using ferromagnetic layer with perpendicular magnetization anisotropy, the magnetic memory element and the magnetic memory which has a structure capable of excellently acting as a trap mechanism of a domain wall and a manufacturing method of the same.

A magnetic memory element of the present invention includes: a first magnetization free layer configured to be composed of ferromagnetic material with perpendicular magnetic anisotropy; a reference layer configured to be provided near the first magnetization free layer; a non-magnetic layer configured to be provided adjacent to the reference layer; and a step formation layer configured to be provided under the first magnetization free layer. The first magnetization free layer includes: a first magnetization fixed region of which magnetization is fixed, a second magnetization fixed region of which magnetization is fixed, and a magnetization free region configured to be connected with the first magnetization fixed region and the second magnetization fixed region. The first magnetization free layer has at least one of a step, a groove and a protrusion inside.

A magnetic memory of the present invention includes: a plurality of the above-described magnetic memory elements configured to be arranged in a matrix shape.

A manufacturing method of a magnetic memory of the present invention, in which the magnetic memory includes a plurality of the above-described magnetic memory elements configured to be arranged in a matrix shape, includes: forming a step formation film; forming a step formation layer by patterning the step formation film; forming an insulation film on the step formation layer; forming an insulation layer which has a step or a groove between the step formation layer and the insulation layer by performing a CMP process and an etching back process to the insulation film in this order; and forming a non-magnetic layer and a reference layer on the insulation layer.

According to the present invention, the magnetic memory element and the magnetic memory which has a structure capable of excellently acting as a trap mechanism of a domain wall and the manufacturing method of the same can be provided.

DESCRIPTION OF EXEMPLARY EMBODIMENTS

Exemplary embodiments of a magnetic memory element, a magnetic memory, and a manufacturing method of the same according to the present invention will be described below referring to the accompanying drawings. The magnetic memory according to the present invention includes a plurality of magnetic memory cells arranged in array shape, each magnetic memory cell including a magnetic memory element.

First Exemplary Embodiment

1. Structure

Figure 1A:
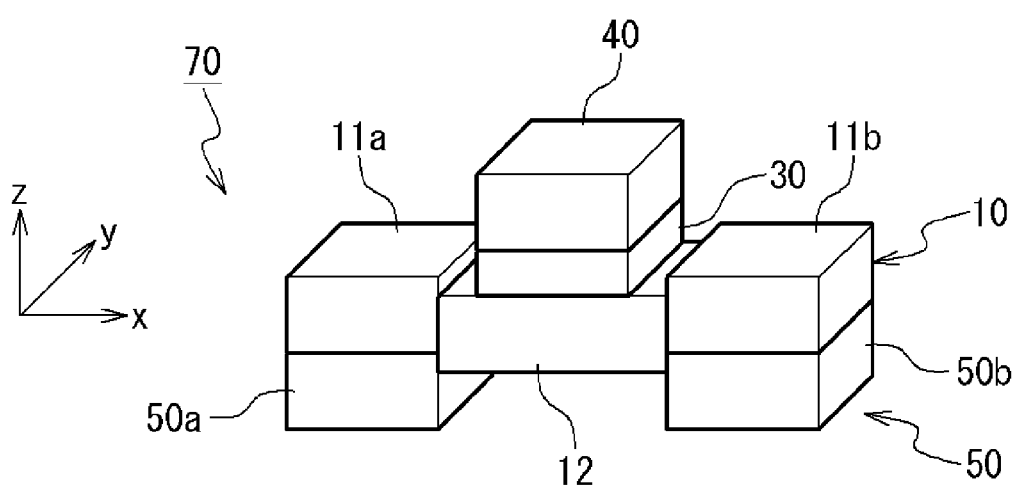
FIG. 1A schematically shows a typical structure of a main portion of a magnetic memory element according to a first exemplary embodiment of the present invention.
Figure 1B:
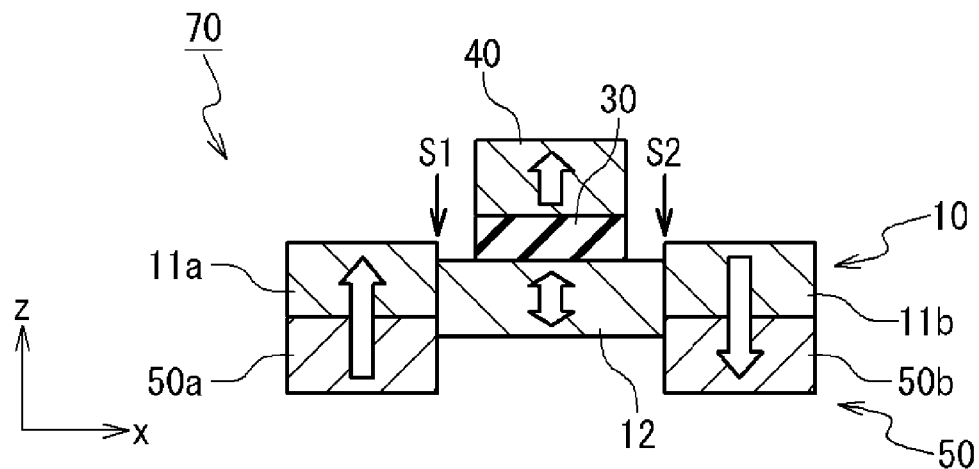
FIG. 1B schematically shows the typical structure of the main portion of the magnetic memory element according to the first exemplary embodiment of the present invention.
Figure 1C:
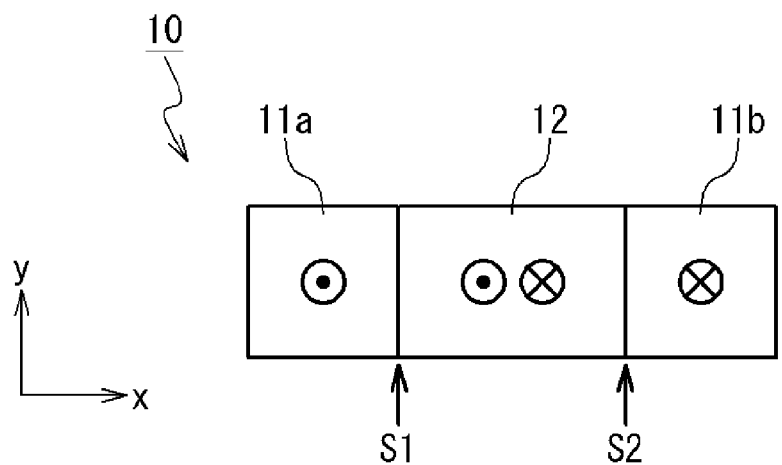
FIG. 1C schematically shows the typical structure of the main portion of the magnetic memory element according to the first exemplary embodiment of the present invention.

FIGS. 1A, 1B and 1C schematically show a typical structure of a main portion of a magnetic memory element 70 according to a first exemplary embodiment of the present invention. FIGS. 1A, 1B and 1C show a perspective view, an x-z sectional view and an x-y plan view, respectively. Here, it is assumed that, in the x-y-z coordinate system shown in the drawings, the z axis is a direction perpendicular to the substrate, and the x axis and the y axis are directions parallel to the surface of the substrate (substrate surface). The magnetic memory element 70 includes a first magnetization free layer 10, a non-magnetic layer 30, a reference layer 40 and a step formation layer 50.

Specifically, FIG. 1C is the plan view schematically showing a structure of the first magnetization free layer 10. The first magnetization free layer 10 is composed of ferromagnetic material with perpendicular magnetic anisotropy. Further, the first magnetization free layer 10 included three regions of a first magnetization fixed region 11a, a second magnetization fixed region 11b and a magnetization free region 12. Each of the first magnetization fixed region 11a and the second magnetization fixed region 11b has magnetization substantially fixed in one direction. In addition, the magnetization of the first magnetization fixed region 11a and the magnetization of the second magnetization fixed region 11b are fixed in directions anti-parallel to each other. In FIG. 1C, the first magnetization fixed region 11a is drawn such that its magnetization is fixed in the +z direction, and the second magnetization fixed region 11b is drawn such that its magnetization is fixed in the −z direction. The magnetization of the magnetization free region 12 can be switched. Here, it can be switched in one of the +z direction and the −z direction.

When the three regions in the first magnetization free layer 10 have the above-described magnetization structure, depending on the magnetization direction of the magnetization free region 12, a domain wall is formed at one of a boundary between the first magnetization fixed region 11a and the magnetization free region 12 and a boundary between the second magnetization fixed region 11b and the magnetization free region 12. In the case of FIG. 1C, when the magnetization of the magnetization free region 12 is in the +z direction, the domain wall is formed at the boundary between the second magnetization fixed region 11b and the magnetization free region 12, and when the magnetization of the magnetization free region 12 is in the −z direction, the domain wall is formed at the boundary between the first magnetization fixed region 11a and the magnetization free region 12.

In the case of FIGS. 1A to 1C, the first magnetization fixed region 11a is adjacent to one end of the magnetization free region 12, and the second magnetization fixed region 11b is adjacent to the other end of the magnetization free region 12. Specifically, in the example of FIG. 1C, the first magnetization fixed region 11a is adjacent to the end of the −x direction side of the magnetization free region 12, and the second magnetization fixed region 11b is adjacent to the end of the +x direction side of the magnetization free region 12. However, the present exemplary embodiment is not limited to this example, and it is enough to contact the magnetization free region 12 with the first magnetization fixed region 11a and the second magnetization fixed region 11b. The positional relation among them is arbitrary. For example, the first magnetization fixed region 11a may have contact with one end of the magnetization free region 12 and the second magnetization fixed region 11b may have contact with the same one end of the magnetization free region 12.

In the case of FIGS. 1A to 1C, the first magnetization free layer 10, the non-magnetic layer 30 and the reference layer 40 are laminated in this order. The reference layer 40 is composed of ferromagnetic material. The non-magnetic layer 30 is composed of non-magnetic material and preferably composed of insulating material. Here, the lamination body with the three layers of the first magnetization free layer 10, the non-magnetic layer 30 and the reference layer 40 constitutes a magnetic tunnel junction (MTJ). Incidentally, the non-magnetic layer 30 and the reference layer 40 having contact with the first magnetization free layer 10 through the non-magnetic layer 30 have contact with the magnetization free region 12 of the first magnetization free layer 10. In addition, the shapes of the non-magnetic layer 30 and the reference layer 40 are arbitrary.

In the case of FIGS. 1A and 1C, the reference layer 40 is preferably composed of ferromagnetic material with perpendicular magnetic anisotropy, and has magnetization which is fixed in substantially one direction. Specifically, in the example of FIG. 1B, the magnetization of the reference layer 40 is fixed in the +z direction. Even though it is not shown here, the reference layer 40 may have a lamination structure as described below. For example, the reference layer 40 has a structure in which three layers of ferromagnetic material, non-magnetic material and ferromagnetic material are laminated in this order. Here, the non-magnetic material sandwiched between two of the ferromagnetic material preferably have a function causing the upper and lower ferromagnetic material to be magnetically coupled in anti-parallel directions (to be synthetic-ferrigmagnetically coupled). Ru is known as the non-magnetic material having this function. By preparing the reference layer 40 which has the lamination structure with the synthetic ferrimagnetic coupling, a leakage magnetic field to exterior can be reduced and a magnetic influence on other layers such as the first magnetization free layer 10 can be reduced. In addition, the reference layer 40 may be adjacent to anti-ferromagnetic material. This is because a magnetization direction of the boundary can be fixed in one direction by being adjacent to the anti-ferromagnetic material and performing heat treatment in a magnetic field.

As the characteristics of the present exemplary embodiment, the step formation layer 50 is provided on the lower side (the −z side) of the first magnetization free layer 10. In the case of FIGS. 1A to 1C, a first step formation layer 50a is provided on the lower side of the first magnetization fixed region 11a and a second step formation layer 50b is provided on the lower side of the second magnetization fixed region 11b. Incidentally, in FIGS. 1A and 1B, the step formation layer 50 is adjacent to the first magnetization free layer 10, but it is not necessary to have contact with the first magnetization free layer 10.

In the present exemplary embodiment, by providing the step formation layer 50 and using the manufacturing method described later, a step is provided in the first magnetization free layer 10. In the case of FIGS. 1A to 1C, a step S11 is formed at the boundary between the first magnetization fixed region 11a and the magnetization free region 12, and a step S2 is formed at the boundary between the second magnetization fixed region 11b and the magnetization free region 12. In the present exemplary embodiment, as described above, the single domain wall is formed inside the first magnetization free layer 10. The steps S1 and S2 function as the pinning sites of this domain wall.

There is no limitation regarding material used for the step formation layer 50. It is enough to use conductive material or insulating material. In addition, it is enough to use magnetic material or non-magnetic material. FIG. 1A shows the example that the step formation layer 50 is composed of ferromagnetic material with perpendicular magnetic anisotropy. In the example of FIGS. 1A to 1C, the first step formation layer 50a and the second step formation layer 50b are magnetically coupled with the first magnetization fixed region 11a and the second magnetization fixed region 11b, respectively.

As not shown in the drawings, the first magnetization fixed region 11a and the second magnetization fixed region 11b are respectively connected to external wiring lines different from each other, and the reference layer 40 is connected to another external wiring line. That is, the magnetic memory element 70 is an element with three terminals. Here, another layer may be inserted into each of a path from the first magnetization fixed region 11a and the external wiring line, a path from the second magnetization fixed region 11b and the external wiring line, and a path from the reference layer 40 and the external wiring line. For example, the first magnetization fixed region 11a and the first step formation layer 50a may be electrically connected, and the first step formation layer 50a may be connected to the external wiring line; on the other hand, the second magnetization fixed region 11b and the second step formation layer 50b may be electrically connected, and the second step formation layer 50b may be connected to another external wiring line.

2. Memory State

Next, a memory state of the magnetic memory element according to the exemplary embodiment will be described.

Figure 2A:
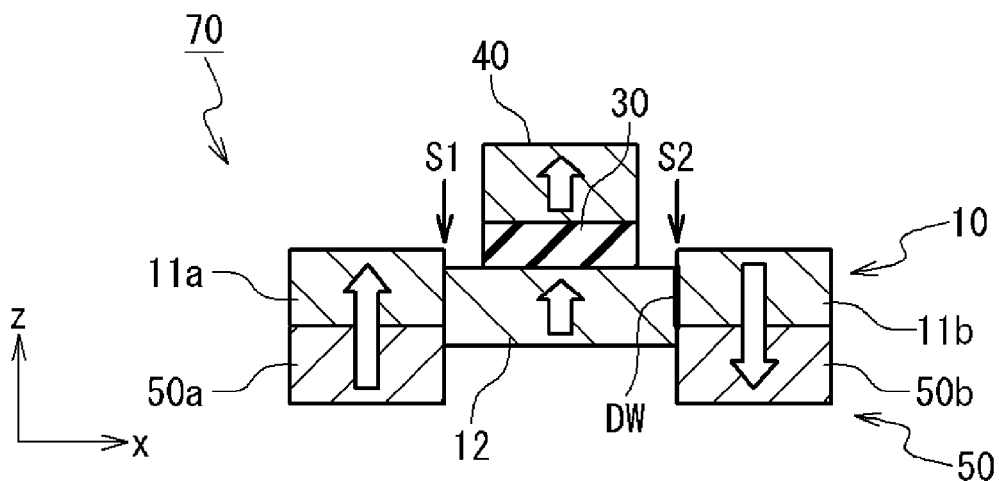
FIG. 2A schematically shows an example of a magnetization state of a memory state of "0" of the magnetic memory element according to the first exemplary embodiment of the present invention.
Figure 2B:
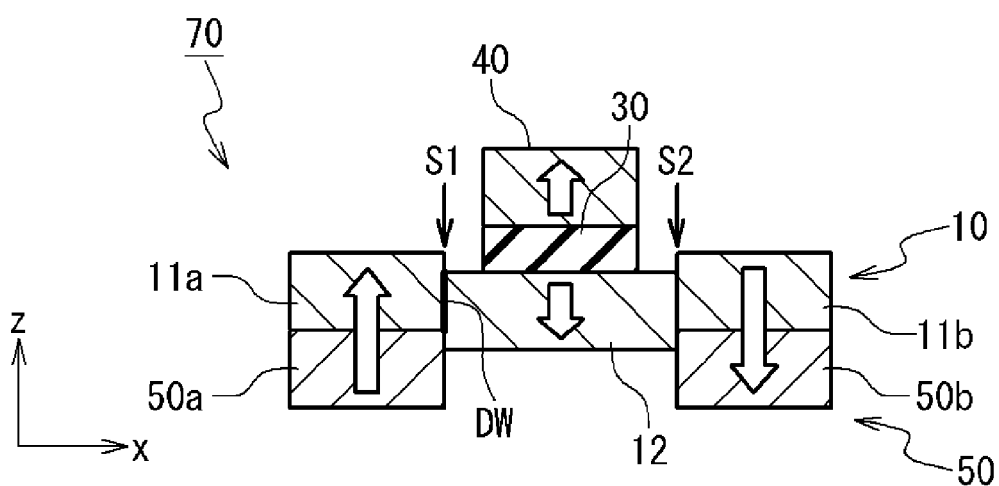
FIG. 2B schematically shows an example of a magnetization state of a memory state of "1" of the magnetic memory element according to the first exemplary embodiment of the present invention.

FIGS. 2A and 2B schematically show examples of magnetization states of memory states of "0" and "1" of the magnetic memory element 70, respectively, according to the first exemplary embodiment of the present invention. FIG. 2A shows the magnetization state of the "0" state, and FIG. 2B shows the magnetization state of the "1" state. Here, the magnetization of the first magnetization fixed region 11a is fixed in the +z direction, and the magnetization of the second magnetization fixed region 11b is fixed in the −z direction.

In the "0" state shown in FIG. 2A, the magnetization of the magnetization free region 12 has a +z direction component. In this case, the domain wall DW is formed at the boundary between the second magnetization fixed region 11b and the magnetization free region 12. On the other hand, in the "1" state shown in FIG. 2B, the magnetization of the magnetization free region 12 has a −z direction component. In this case, the domain wall DW is formed at the boundary between the first magnetization fixed region 11a and the magnetization free region 12.

In FIGS. 2A and 2B, the magnetization of the reference layer 40 is fixed in the +z direction. In this case, the magnetization configurations of the MTJs in the "0" state shown in FIG. 2A and the "1" state shown in FIG. 2B are parallel and anti-parallel, respectively. Here, the MTJ is composed of the first magnetization free layer 10, the non-magnetic layer 30 and the reference layer 40. Therefore, a low resistance value and a high resistance value are realized when currents are made to flow thorough these MTJs, respectively.

Incidentally, the relationship between the magnetization states and the memory states ("0", "1") defined in FIGS. 2A and 2B is arbitrary, and it is not limited to this case.

3. Initialization Method

Next, an initialization method of a memory state of the magnetic memory element 70 according to the first exemplary embodiment of the present invention will be described. Here, the initialization means that a process for making magnetization of the first magnetization fixed region 11a and magnetization of the second magnetization fixed region 11b be in directions anti-parallel to each other and introducing a single domain wall into the first magnetization free layer 10.

Figure 3A:
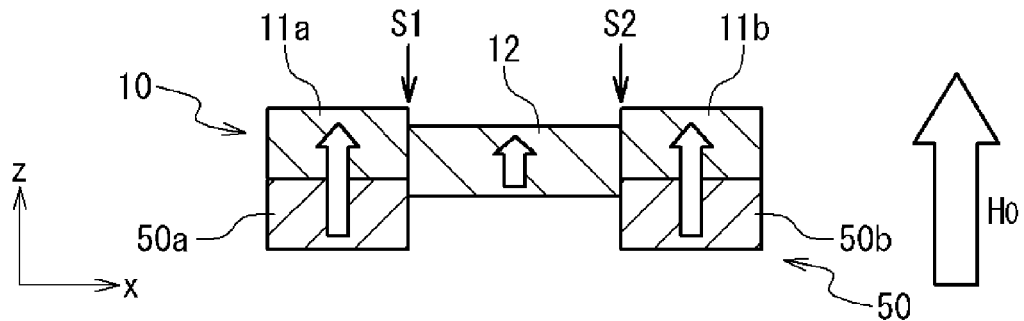
FIG. 3A schematically shows an example of a method of initializing a memory state of the magnetic memory element according to the first exemplary embodiment of the present invention.
Figure 3B:
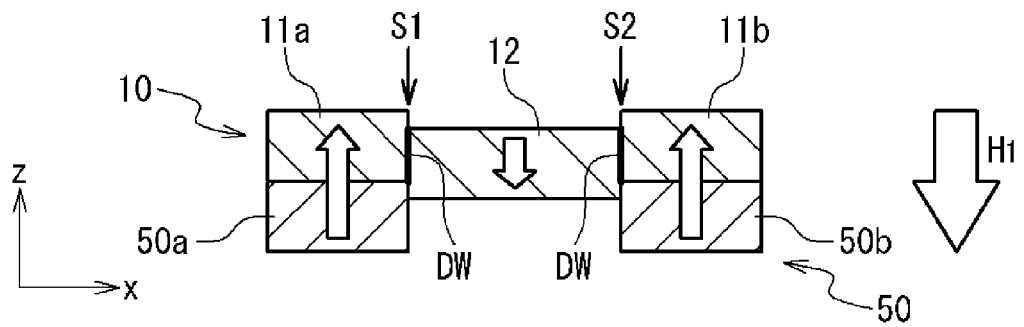
FIG. 3B schematically shows the example of the method of initializing the memory state of the magnetic memory element according to the first exemplary embodiment of the present invention.
Figure 3C:
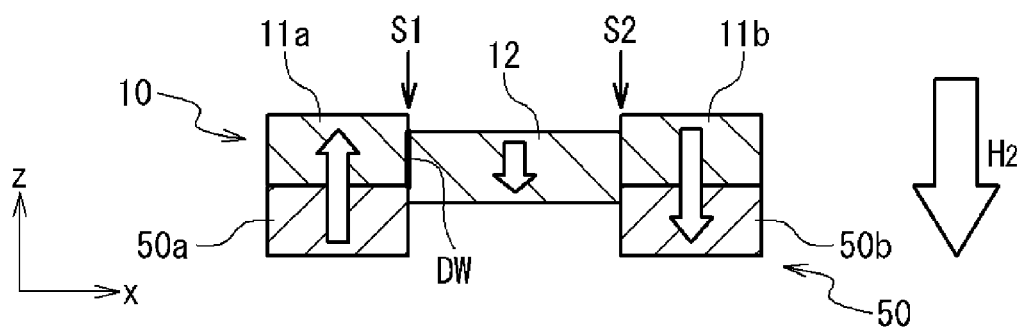
FIG. 3C schematically shows the example of the method of initializing the memory state of the magnetic memory element according to the first exemplary embodiment of the present invention.

FIGS. 3A to 3C schematically show an example of an initialization method of a memory state of the magnetic memory element 70 according to the first exemplary embodiment of the present invention. Here, in FIGS. 3A to 3C, for simply understanding, layers other than the first magnetization free layer 10 and the step formation layer 50 are omitted. In FIGS. 3A to 3C, the first step formation layer 50a and the second step formation layer 50b are composed of ferromagnetic material with perpendicular magnetic anisotropy. In addition, the first step formation layer 50a is harder than the second step formation layer 50b.

In the example of the initialization method shown in FIGS. 3A to 3C, the initialization of the memory state is performed by applying external magnetic fields in the following steps. First, a sufficiently large external magnetic field H0 in the +z direction is applied. Here, as shown in FIG. 3A, the magnetization of all regions is turned to the +z direction. Next, a relatively small external magnetic field H1 in the −z direction is applied. Here, as shown in FIG. 3B, the magnetization of the magnetization free region 12 is firstly reversed to the −z direction. Next, the external magnetic field in the −z direction is made to be larger (H2). Here, as shown in FIG. 3C, the magnetization of the second magnetization fixed region 11b and the magnetization of the second step formation layer 50b are reversed to the −z direction. The state shown in FIG. 3C is a state that the domain wall is trapped at the boundary between the first magnetization fixed region 11a and the magnetization free region 12, namely at the step S1; this corresponds to the "1" state of FIG. 2B. By applying the external magnetic fields like this, the memory state of the magnetic memory element 70 can be initialized.

4. Writing Method

Next, a method of writing information to the magnetic memory element 70 according to the first exemplary embodiment of the present invention will be described.

Figure 4A:
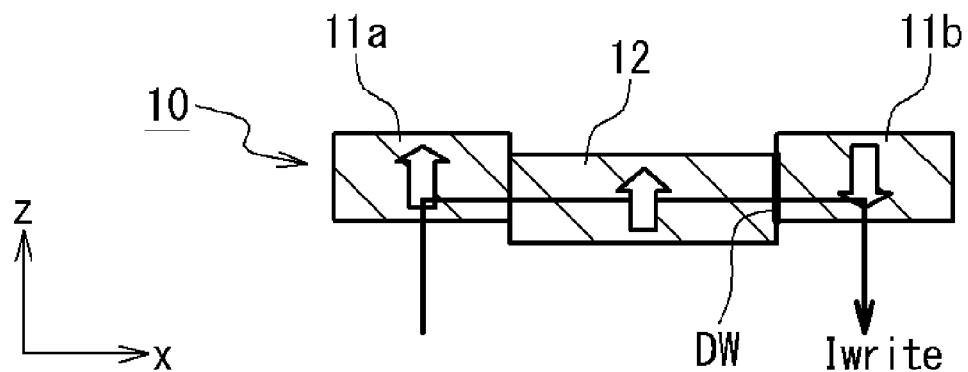
FIG. 4A schematically shows an example of a method of writing information to the magnetic memory element according to the first exemplary embodiment of the present invention.
Figure 4B:
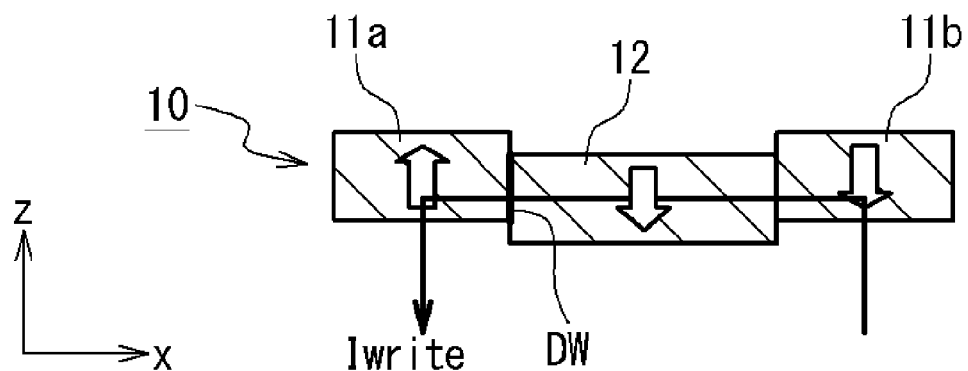
FIG. 4B schematically shows an example of a method of writing information to the magnetic memory element according to the first exemplary embodiment of the present invention.

FIGS. 4A and 4B schematically show examples of a method of writing information to the magnetic memory element according to the first exemplary embodiment of the present invention. Here, in FIGS. 4A to 4B, for simply understanding, layers other than the first magnetization free layer 10 are omitted.

In the "0" state defined by FIG. 2A, a current is introduced in a direction shown by an arrow Iwrite in FIG. 4A. In this case, conduction electrons flow from the second magnetization fixed region 11b through the magnetization free region 12 to the first magnetization fixed region 11a in the magnetization free layer 10. At that time, the spin transfer torque (STT) works on the domain wall DW formed at the boundary between the second magnetization fixed region 11b and the magnetization free region 12, and the domain wall moves in a negative direction of the x axis. That is, the current induced domain wall motion arises. Here, the writing current decreases in the negative direction of the x axis further than the boundary between the first magnetization fixed region 11a and the magnetization free region 12 (because the writing current also flows into the current terminal which is not shown here). Therefore, the domain wall DW stops at the boundary between the first magnetization fixed region 11a and the magnetization free region 12. This state corresponds to the "1" state defined by FIG. 2B. Like this, the "1" can be written.

In the "1" state defined by FIG. 2B, a current is introduced in a direction shown by an arrow Iwrite in FIG. 4B. In this case, conduction electrons flow from the first magnetization fixed region 11a through the magnetization free region 12 to the second magnetization fixed region 11b in the magnetization free layer 10. At that time, the spin transfer torque (STT) works on the domain wall DW formed at the boundary between the first magnetization fixed region 11a and the magnetization free region 12, and the domain wall moves in a positive direction of the x axis. That is, the current induced domain wall motion arises. Here, the writing current decreases in the positive direction of the x axis further than the boundary between the second magnetization fixed region 11b and the magnetization free region 12 (because the writing current also flows into the current terminal which is not shown here). Therefore, the domain wall DW stops at the boundary between the second magnetization fixed region 11b and the magnetization free region 12. This state corresponds to the "0" state defined by FIG. 2A. Like this, the "0" can be written.

Incidentally, when the "0" writing to the "0" state and the "1" writing to the "1" state are performed, the memory stats are not changed. That is, the over-writing can be performed.

5. Reading Method

Next, a method of reading information from the magnetic memory element 70 according to the first exemplary embodiment of the present invention will be described.

Figure 5A:
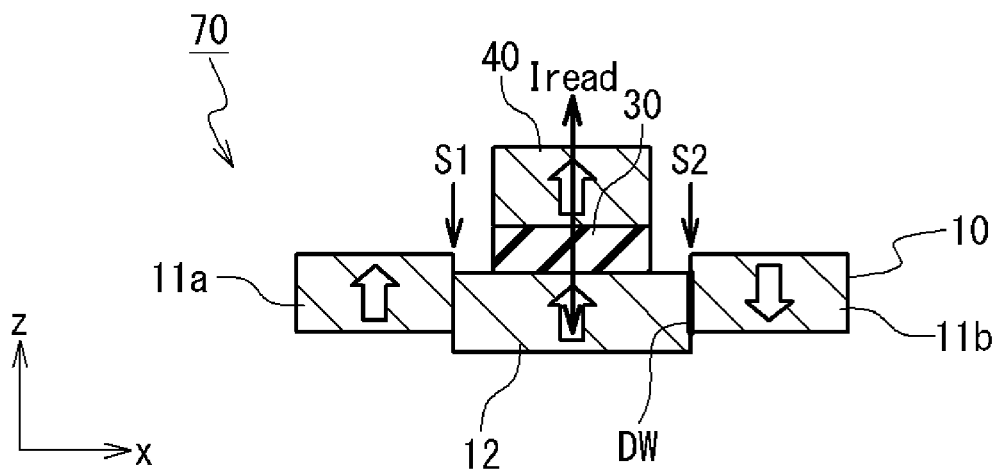
FIG. 5A schematically shows an example of a method of reading information from the magnetic memory element according to the first exemplary embodiment of the present invention.
Figure 5B:
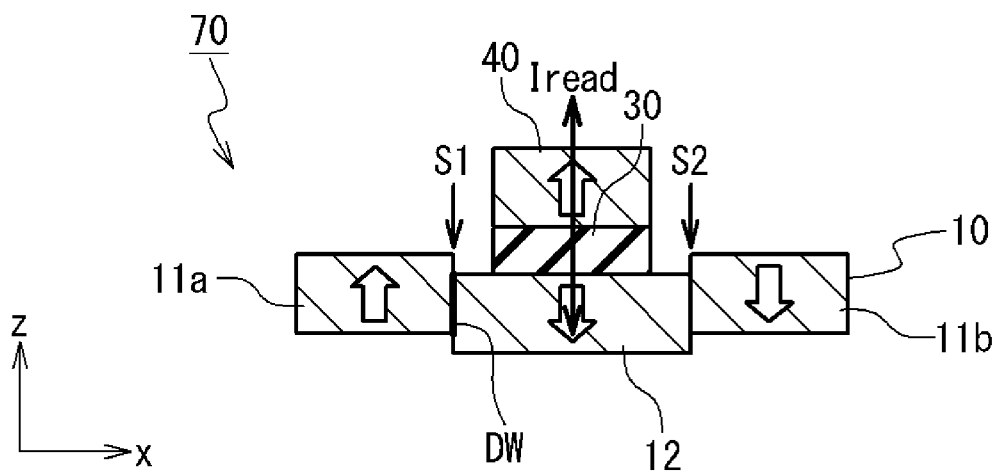
FIG. 5B schematically shows an example of a method of reading information from the magnetic memory element according to the first exemplary embodiment of the present invention.

FIGS. 5A and 5B schematically show examples of a method of reading information from the magnetic memory element 70 according to the first exemplary embodiment of the present invention. Here, the magnetic memory element 70 including the structure shown in FIGS. 1A to 1C will be described. In the present exemplary embodiment, the information reading is performed by mainly using the tunneling magnetoresistive effect (TMR). Thus, a current Iread is introduced in a direction where the current pass through the magnetic tunnel junction (MTJ) composed of the first magnetization free layer 10, the non-magnetic layer 30 and the reference layer 40. Here, the direction of the current Iread is arbitrary.

As shown in FIG. 5A, when the current Iread is introduced in the "0" state defined by FIG. 2A, since the magnetization of the MTJ is in a parallel state, a low resistance value can be achieved. On the other hand, as shown in FIG. 5B, when the current Iread is introduced in the "1" state defined by FIG. 2B, since the magnetization of the MTJ is in an anti-parallel state, a high resistance value can be achieved. As described above, the information stored in the magnetic memory element can be detected as the difference of the resistance.

6. Circuit Configuration

Figure 6:
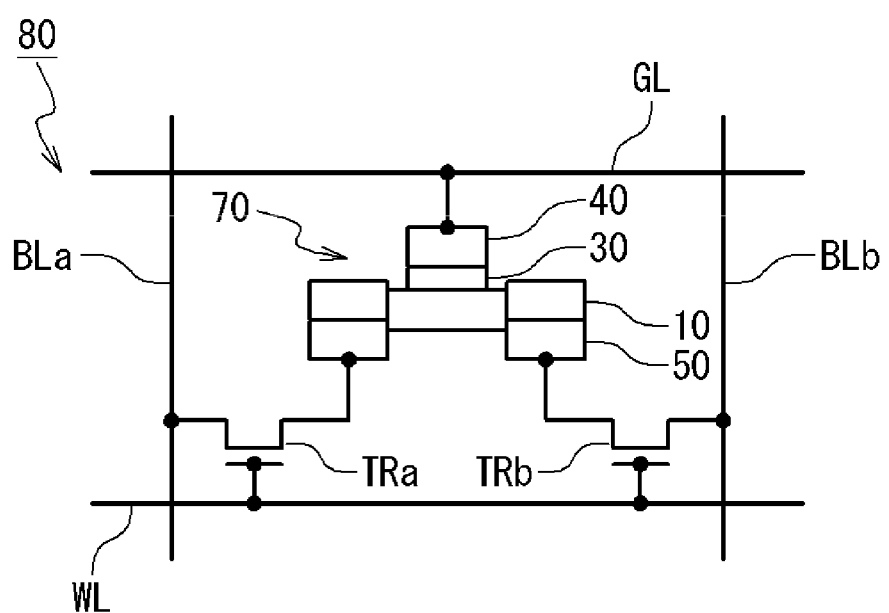
FIG. 6 shows a configuration example of a circuit for one bit of a magnetic memory cell according to the first exemplary embodiment of the present invention.

Next, a circuit configuration for introducing the writing current and the reading current into the magnetic memory cell 80 including the magnetic memory element 70 according to the first exemplary embodiment of the present invention. FIG. 6 shows a configuration example of a circuit for one bit of the magnetic memory cell 80 according to the first exemplary embodiment of the present invention.

In the example shown in FIG. 6, the magnetic memory element 70 is a three-terminal element, and connected to a word line WL, a ground line GL, and a bit line pair BLa and BLb. For example, a terminal connected to the reference layer 40 is connected to the ground line GL for the reading. A terminal connected to the first magnetization fixed region 11a is connected to one of a source and a drain of a transistor TRa, and the other of the source and the drain is connected to the bit line BLa. A terminal connected to the second magnetization fixed region 11b is connected to one of a source and a drain of a transistor TRb, and the other of the source and the drain is connected to the bit line BLb. Gates of the transistors TRa and TRb are connected to the common word line WL. Incidentally, FIG. 6 shows an example that the first magnetization fixed region 11a is connected to the transistor TRa through the first step formation layer 50a, and the second magnetization fixed region 11b is connected to the transistor TRb through the second step formation layer 50b.

When the data writing is performed, the word line WL is set at a high level to turn on the transistors TRa and TRb. In addition, one of the bit line pair BLa and BLb is set at a high level and the other is set at a low level (a ground level). As a result, through the transistors TRa and TRb and the first magnetization free layer 10, the writing current flows between the bit line BLa and the bit line BLb.

When the data reading is performed, the word line WL is set at a high level to turn on the transistors TRa and TRb. In addition, the bit line BLa is set at an open state and the bit line BLb is set at a high level. As a result, the reading current flows from the bit line BLb through the transistor TRb and the MTJ of the magnetic memory element 70 to the ground line GL. According to this, the reading can be performed by using the magnetoresistive effect.

Figure 7:
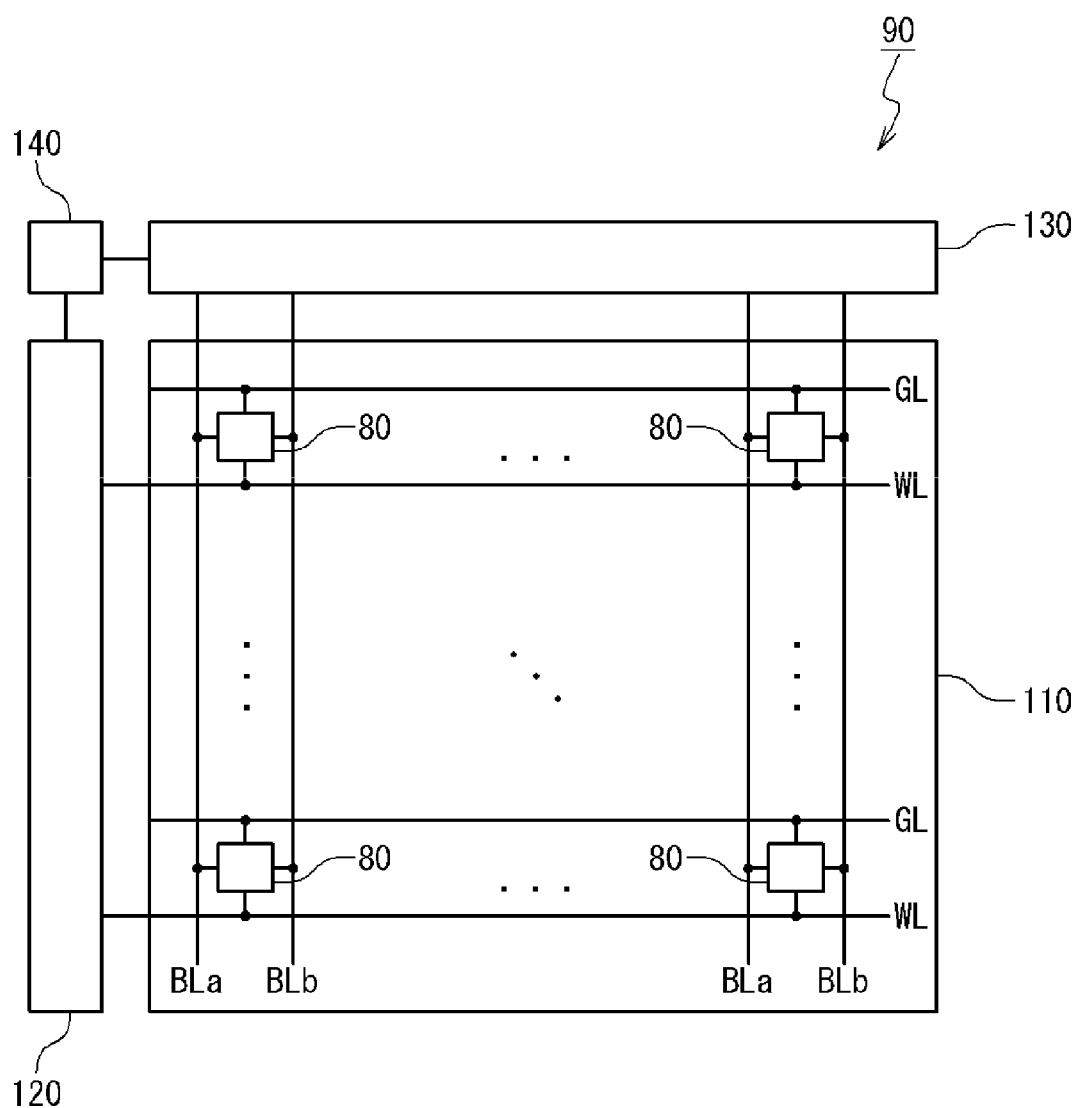
FIG. 7 is a block diagram showing an example of a configuration of a magnetic memory according to the first exemplary embodiment of the present invention.

FIG. 7 is a block diagram showing an example of a configuration of the magnetic memory 90 according to the first exemplary embodiment of the present invention. The magnetic memory 90 includes: a memory cell array 110, an X driver 120, a Y driver 130 and a controller 140. The memory cell array 110 includes a plurality of the magnetic memory cells 80 arranged in an array shape. Each of the plurality of the magnetic memory cells 80 includes above-mentioned magnetic memory element 70. As shown in FIG. 6, the magnetic memory cell 80 is connected to the word line WL, the ground line GL and the bit line pair BLa and BLb. The X driver 120 is connected to a plurality of the word lines WL and drives a selection word line, which is connected to an access target of the magnetic memory cell 80, of the plurality of the word lines WL. The Y driver 130 is connected to a plurality of the bit line pairs BLa and BLb and sets each bit line in the state corresponding to the data writing or the data reading. The controller 140 respectively controls the X driver 120 and the Y driver 130 based on the data writing or the data reading.

7. Manufacturing Method

Next, a manufacturing method of the magnetic memory element 70 according to the first exemplary embodiment of the present invention will be described. FIGS. 8A to 8H are sectional views schematically showing a flow of an example of a method of manufacturing the magnetic memory element 70 according to the first exemplary embodiment of the present invention.

Figure 8A:
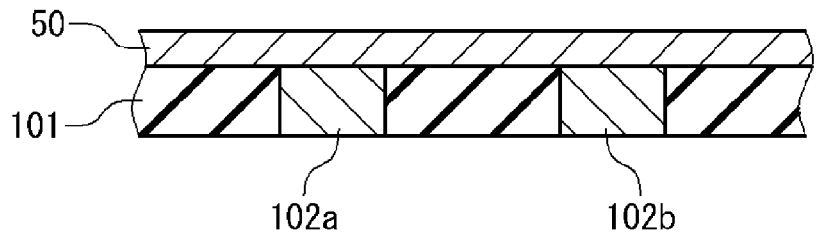
FIG. 8A is a sectional view schematically showing a flow of an example of a method of manufacturing the magnetic memory element according to the first exemplary embodiment of the present invention.
Figure 8B:
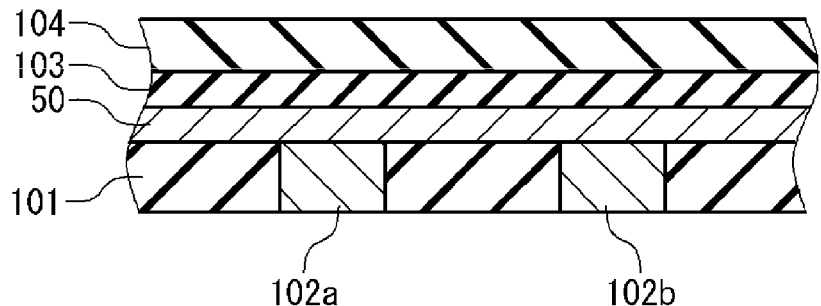
FIG. 8B is a sectional view schematically showing the flow of the example of the method of manufacturing the magnetic memory element according to the first exemplary embodiment of the present invention.
Figure 8C:
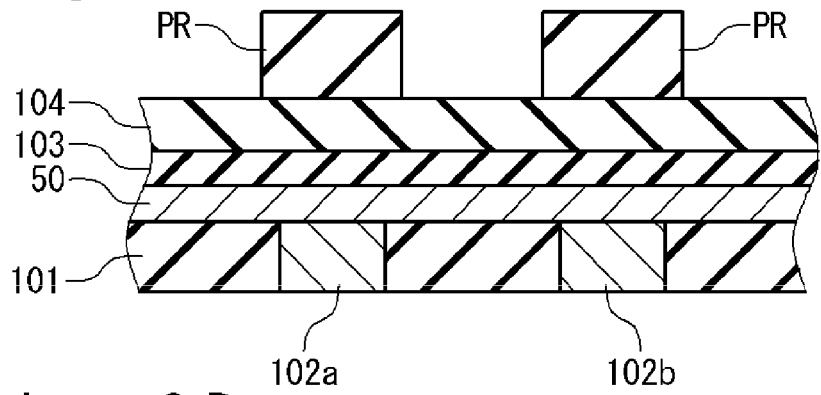
FIG. 8C is a sectional view schematically showing the flow of the example of the method of manufacturing the magnetic memory element according to the first exemplary embodiment of the present invention.
Figure 8D:
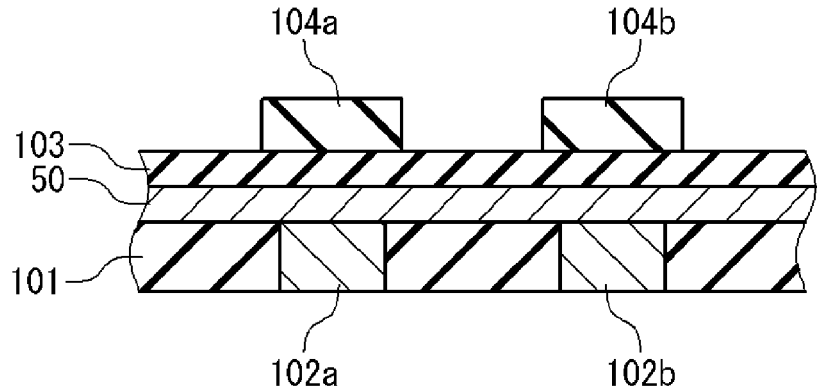
FIG. 8D is a sectional view schematically showing the flow of the example of the method of manufacturing the magnetic memory element according to the first exemplary embodiment of the present invention.
Figure 8E:
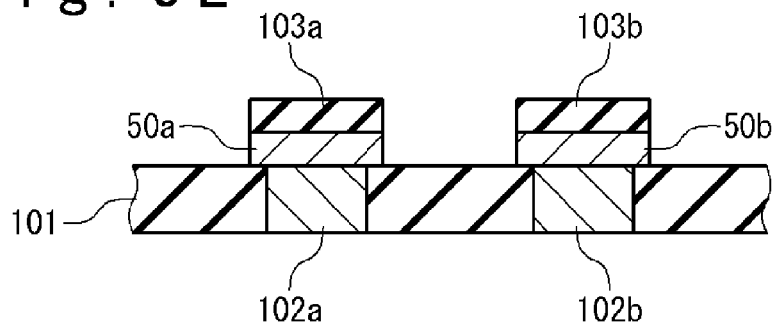
FIG. 8E is a sectional view schematically showing the flow of the example of the method of manufacturing the magnetic memory element according to the first exemplary embodiment of the present invention.
Figure 8F:
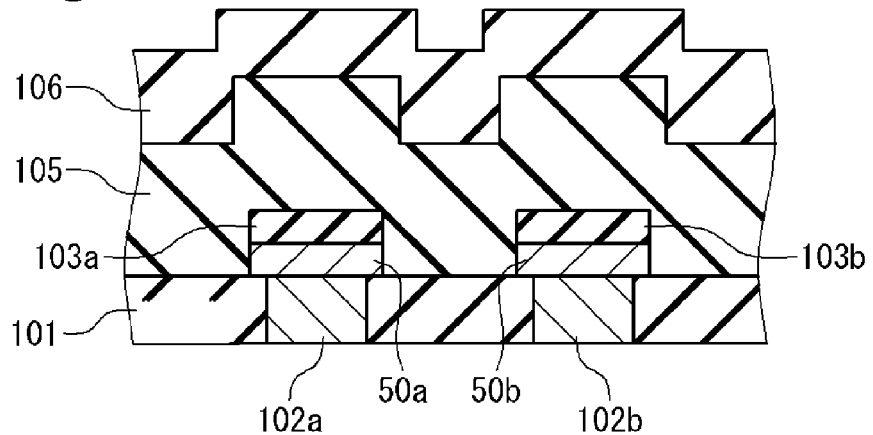
FIG. 8F is a sectional view schematically showing the flow of the example of the method of manufacturing the magnetic memory element according to the first exemplary embodiment of the present invention.
Figure 8G:
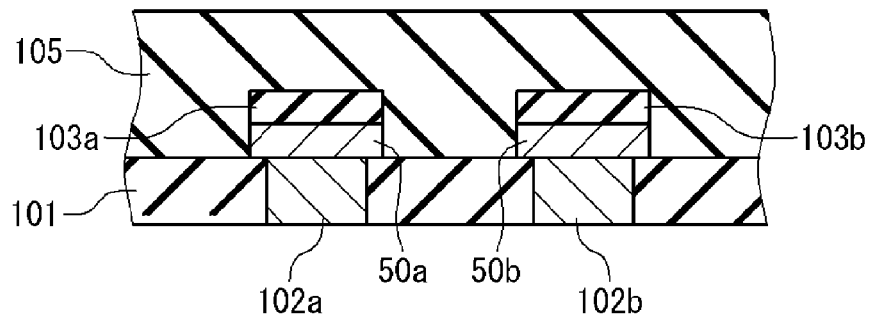
FIG. 8G is a sectional view schematically showing the flow of the example of the method of manufacturing the magnetic memory element according to the first exemplary embodiment of the present invention.
Figure 8H:
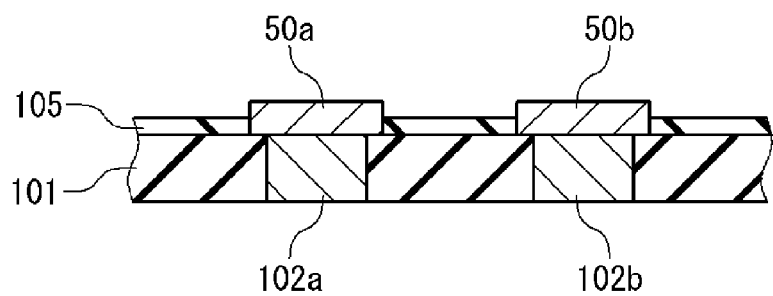
FIG. 8H is a sectional view schematically showing the flow of the example of the method of manufacturing the magnetic memory element according to the first exemplary embodiment of the present invention.

First, a step formation layer 50 is formed on a substrate where a first electrode 102a and a second electrode 102b are embedded in a first interlayer film 101. This situation is shown in FIG. 8A. Next, a first hard mask 103 and a second hard mask 104 are formed on the step formation layer 50. This situation is shown in FIG. 8B. Then, patterning of photoresist PR is performed by coating, exposing and developing the photoresist PR. This situation is shown in FIG. 8C. Next, etching of the second hard mask 104 is performed by using the patterned photoresist PR as a mask, followed by removing the photoresist PR. This situation is shown in FIG. 8D. Then, etching of the first hard mask 103 and the step formation layer 50 is performed by using the patterned second hard masks 104a and 104b. This situation is shown in FIG. 8E. Here, FIG. 8E shows a case that the second hard masks 104a and 104b are removed during the etching of the first hard mask 103 and the step formation layer 50. After that, a second interlayer film 105 and a third interlayer film 106 are formed such that the patterned first hard masks 103a and 103b, the patterned step formation layers 50a and 50b and the first interlayer film 101 are covered with them. This situation is shown in FIG. 8F. Next, planarization is performed by using the CMP processing. This situation is shown in FIG. 8G. Here, FIG. 8G shows a case that the third interlayer film 106 and a protrusion portion of the second interlayer film 105 are removed by the CMP processing. Finally, an etching-back process of the whole area is performed. In this case, when etching rates of the second interlayer film 105 and the step formation layer 50 are different from each other, the steps at the edges of the step formation layers 50 are formed. This situation is shown in FIG. 8H. Here, FIG. 8H shows a case that the etching late of the step formation layer 50 is lower than that of the second interlayer film 105. By forming the first magnetization free layer 10, the non-magnetic layer 30 and the reference layer 40 on the structure shown in FIG. 8H and performing appropriate patterning, the magnetic memory element 70 is formed. The methods of forming the first magnetization free layer 10, the non-magnetic layer 30 and the reference layer 40 are arbitrary.

One of the characteristics of the first exemplary embodiment of the present invention is that the step is formed on the substrate surface where the first magnetization free layer 10 is formed. As described in FIGS. 8A to 8H, this step is formed by using the etching rate difference between the step formation layer 50 and the interlayer film (the second interlayer film 105 in the example of FIGS. 8A to 8H) around the step formation layer 50. Such etching rate difference can be easily designed based on material and an etching method to be used.

In addition, the size of the step to be formed can be controlled based on not only the above-mentioned etching rate difference but also the etching-back time. For example, the size of the step will be larger if the etching time is longer after the etching-back process reaches the step format ion layer 50. Therefore, the height of the step, which is in a several nano-meter level, can be adjusted with high controllability.

Further, FIGS. 8A to 8H show the example that the etching rate of the step formation layer 50 is smaller than that of the second interlayer film 105 and thus the surface of the step formation layer 50 is higher than that of the second interlayer film 105. However, these may be reversed. That is, the etching rate of the step formation layer 50 may be larger than that of the second interlayer film 105 and thus the surface of the step formation layer 50 may be lower than that of the second interlayer film 105.

In addition, in the manufacturing method shown in FIGS. 8A to 8H, a rectangular feature in the etching process for the step formation layer 50 shown in FIG. 8E is reflected to a rectangular feature of the step. Therefore, in this etching process, by performing the etching using the reactive ion etching (RIE) method and so on such that the rectangular feature becomes stronger, the step which has higher rectangular feature can be formed.

8. Material

Next, material which can be used for the first magnetization free layer 10, the non-magnetic layer 30, the reference layer 40 and the step formation layer 50 will be described.

The first magnetization free layer 10 is preferably composed of ferromagnetic material with perpendicular magnetic anisotropy as described before. Specifically, it is exemplified as an alloy material such as a Fe—Pt alloy, a Fe—Pd alloy, a Co—Pt alloy, a Co—Pd alloy, a Tb—Fe—Co alloy, a Gd—Fe—Co alloy, a Tb—Fe alloy, a Tb—Co alloy, a Gd—Fe alloy, a Gd—Co alloy, a Co—Cr—Pt alloy, a Co—Re—Pt alloy, a Co—Ru—Pt alloy, a Co—W alloy and the like, and an alternately lamination film such as a Co/Pt lamination film, a Co/Pd lamination film, a Co/Ni lamination film, a Co/Cu lamination film, a Co/Ag lamination film, a Co/Au lamination film, a Fe/Pt lamination film, a Fe/Pd lamination film, a Fe/Au lamination film and the like. Especially, among them, the inventor has experimentally ascertained that the current induced domain wall motion with high controllability can be realized by using the Co/Ni lamination film (Applied Physics Express, vol. 1, p. 101303, (2008): Non-patent literature 4). Therefore, the Co/Ni lamination film is preferable material for the magnetization free layer 10.

The non-magnetic layer 30 is preferably composed of insulating material. Specifically, it is exemplified as Mg—O, Al—O, Al—N, Ti—O and so on.

The reference layer 40 is, for example, composed of ferromagnetic material with perpendicular magnetic anisotropy. In this case, since the material which can be used for the reference layer 40 overlaps with the exemplified material which can be used for the first magnetization free layer 10, its description is omitted. However, since the reference layer 40 is required that its magnetization is stably fixed, it is preferable that the material is hard magnetic material. From this viewpoint, the material preferably contains a Fe—Pt alloy, a Fe—Pd alloy, a Co—Pt alloy, a Co/Pt lamination film, a Co/Pd lamination film and so on. In addition, it is required that the magnetization direction is fixed in one direction and it is preferable that its leakage magnetic field to the exterior is smaller. For this reason, as described before, it is preferable that the reference layer 40 has a lamination structure with the synthetic ferrimagnetic coupling. That is, it is preferable that the reference layer 40 has, for example, a lamination structure of ferromagnetic material/Ru/ferromagnetic material. Further, the reference layer 40 may be composed of ferromagnetic material with in-plane magnetic anisotropy. In this case, all kinds of magnetic material can be used. Typical example is Co—Fe and the like. Here, an exemplary embodiment of the case that the material with in-plane magnetic anisotropy is used for the reference layer 40 will be described later as a fourth modification example.

For the step formation layer 50, various material described before can be used. It is enough for the step formation layer 50 to have the etching rate difference between the step formation layer 50 and the interlayer film surrounded thereof (the second interlayer film 105 in the figure), and the step formation layer 50 may be composed of conductive material or may be insulating material. Or it may be composed of magnetic material or may be non-magnetic material. In addition, it may be a lamination body including a plurality of material. Further, the step formation layer 50 contains ferromagnetic material with perpendicular magnetic anisotropy in order to strongly fix the magnetization of the first magnetization fixed region 11a and the second magnetization fixed region 11b in the first magnetization free layer 10. Since material which can be used for this case overlaps with the exemplified material which can be used for the first magnetization free layer 10, the description of the material is omitted.

9. Effect

Next, effects obtained by the present exemplary embodiment will be described. In the domain wall motion MRAM using the current induced domain wall motion phenomenon, the ideal domain wall pinning sites with the precipitous steps can be formed by using the present exemplary embodiment. According to this, two effects can be mainly obtained.

The first effect of the present exemplary embodiment is improvement of the retention property. In the domain wall motion MRAM, the domain wall pinning sites are provided based on the information of "0" and "1" to be stored, and the information is stored as the position of the domain wall. To achieve the high retention property, it is preferable that each pinning site has a deep pinning potential. The present exemplary embodiment provides the very precipitous steps with the several nano-meter levels which work as the pinning sites. According to this, the memory state can be stably retained.

The second effect of the present exemplary embodiment is reduction of the writing current variation. In the domain wall motion MRAM, the domain wall is made to move by introducing the current into the first magnetization free layer 10 for writing. Here, if the initial state of the domain wall is different, the necessary writing current will be different. If there is variety of the initial state among bits, there will be variety of the writing current among the bits. In addition, if there is self variety of the initial state in one bit, there will be self variety of the writing current in the bit. Here, by introducing the pinning sites which are provided using the present exemplary embodiment, the domain walls to be formed are made uniform. That is, the variety of the initial state among the domain walls can be reduced. Consequently, the variation of the writing currents among the bits and the self variation in the bit can be reduced.

10. Example

Figure 9:
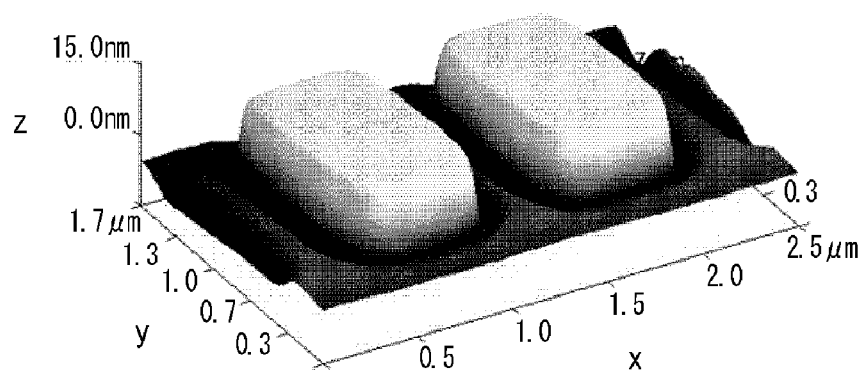
FIG. 9 shows a result of AFM observation of a substrate surface with a step which is manufactured by a manufacturing method shown in FIGS. 8A to 8H.

Next, a result (an example) of which the first exemplary embodiment of the present invention is implemented will be described. FIG. 9 shows a result of AFM observation of a substrate surface with a step which is manufactured by the manufacturing method shown in FIGS. 8A to 8H. To manufacturing the domain wall motion MRAM, the first magnetization free layer 10 is formed on this substrate surface.

Here, in the manufacturing method shown in FIGS. 8A to 8H, Ta (30 nm) is used for the step formation layer 50, Si—N (30 nm) is used for the first hard mask 103, Si—O (20 nm) is used for the second hard mask 104, Si—N (160 nm) is used for the second interlayer film 105, and Si—O (200 nm) is used for the third interlayer film 106. In addition, $CF_4$ series gas and a $Cl_2$ series gas are used in the etching process in FIG. 8E, ceria series slurry is used in the CMP process in FIG. 8G, and an Ar series ion beam etching method is used in the etching back process in FIG. 8H. The longer the etching back time is in the etching back process in FIG. 8H, the higher the height of the step is. As a result, the step with approximately several nm to 20 nm is formed. When SEM observation for a cross section is performed, it is confirmed that the very precipitous step in which a taper angle at the step portion is approximately 80 degrees is formed.

Incidentally, as material combinations which can be used for increasing the height of the upper surface of the step formation layer 50 as compared with the height of the upper surface of the region surrounding the step formation layer 50, the followings are exemplified. For example, as the second interlayer film 105 and the third interlayer film 106, material of Si—O series, Si—N series and Si—O—N series can be used. As the step formation layer 50, Ti, V, Cr, Zr, Nb, Mo, Hf, W and the like can be used in addition to Ta.

11. Modification Example

The magnetic memory element 70 described above can be achieved by using the modification examples described below.

11-1. First Modification Example

Figure 10A:
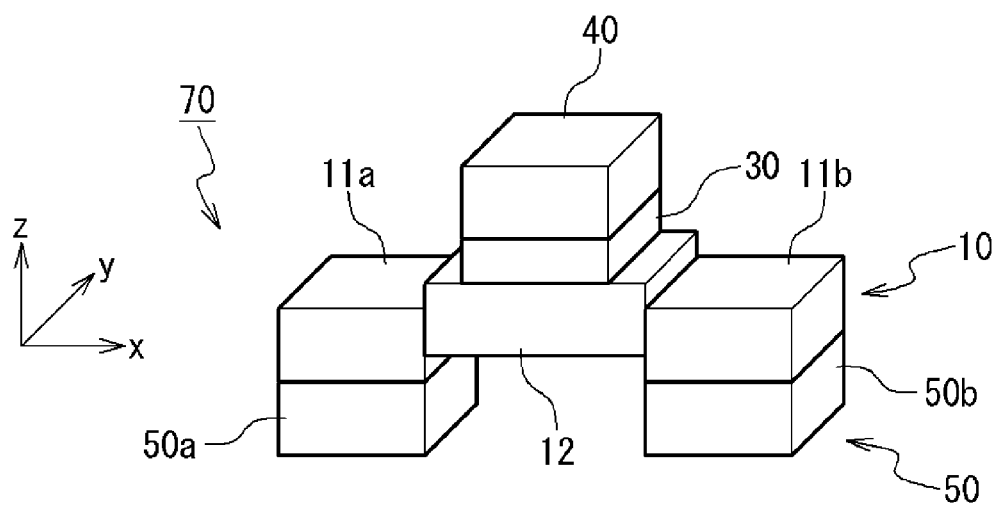
FIG. 10A schematically shows a structure of a first modification example of a magnetic memory element according to the first exemplary embodiment of the present invention.
Figure 10B:
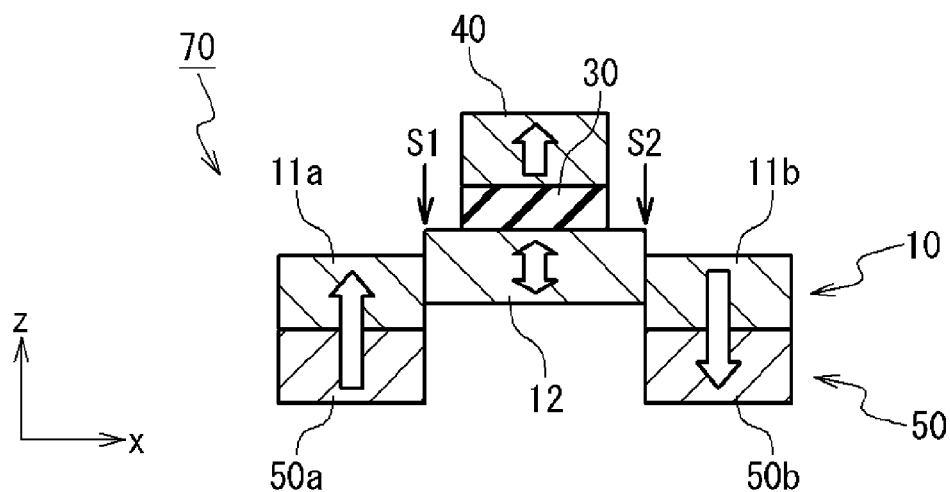
FIG. 10B schematically shows the structure of the first modification example of the magnetic memory element according to the first exemplary embodiment of the present invention.

FIGS. 10A and 10B schematically show a structure of the first modification example of the magnetic memory element according to the first exemplary embodiment of the present invention. FIG. 10A shows the perspective view and FIG. 10B shows the x-z sectional view. The first modification example relates to the step shape.

In the present exemplary embodiment, in the first magnetization free region 10, the first step S1 is provided at the boundary between the first magnetization fixed region 11a and magnetization free region 12, and the second step S2 is provided at the boundary between the second magnetization fixed region 11b and the magnetization free region 12. In the example shown in FIGS. 1A to 1C, the height of the magnetization free region 12 is lower than the height of the first magnetization fixed region 11a and the height of the second magnetization fixed region 11b. However, the shape of the step is arbitrary. For example, as shown in FIGS. 10A and 10B, the height of the magnetization free region 12 may be higher than the height of the first magnetization fixed region 11a and the height of the second magnetization fixed region 11b. In addition, not shown here, the height of one of the first magnetization fixed region 11a and the second magnetization fixed region 11b may be higher than the height of the magnetization free region 12, and the height of the other may be lower than the height of the magnetization free region 12.

The steps can be formed in any direction by adjusting the etching rate difference between the step formation layer 50 and the interlayer film surrounding thereof. That is, the FIGS. 8A to 8H show the example that the etching rate of the step formation layer 50 is lower than the etching rate of the second interlayer film 105, and thus, the second interlayer 105 is etched earlier than the step formation layer 50 during the etching back process. However, by designing the material and the etching method such that the etching rate of the step formation layer 50 is higher than the etching rate of the second interlayer film 105, the steps shown in FIGS. 10A and 10B can be formed.

11-2. Second Modification Example

Figure 11A:
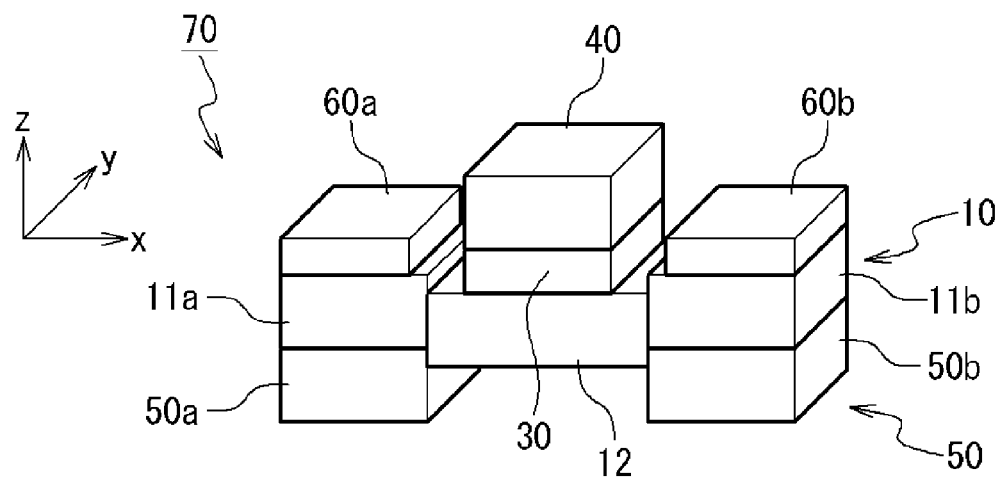
FIG. 11A schematically shows a structure of a second modification example of a magnetic memory element according to the first exemplary embodiment of the present invention.
Figure 11B:
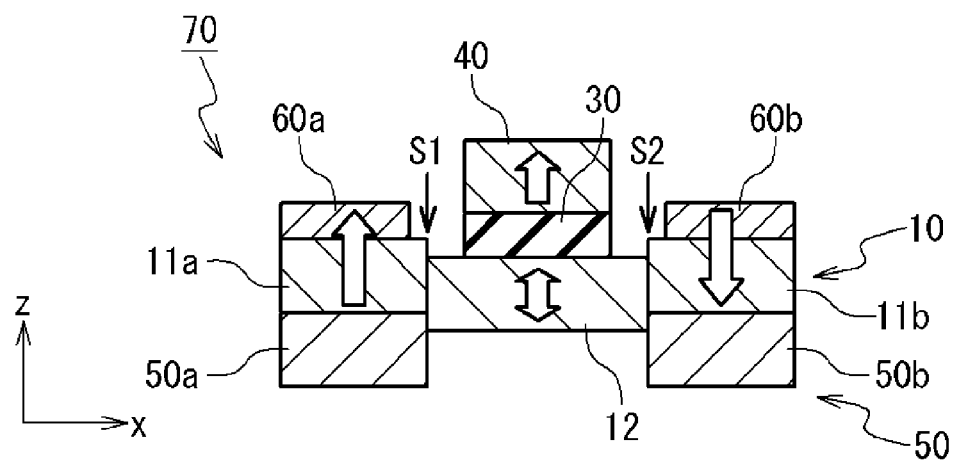
FIG. 11B schematically shows the structure of the second modification example of the magnetic memory element according to the first exemplary embodiment of the present invention.

FIG. 11A schematically show structures of the second modification example of the magnetic memory element 70 according to the first exemplary embodiment of the present invention. FIG. 11A shows the perspective view and FIG. 11B shows the x-z sectional view. The second modification example relates to the material of the step formation layer 50, the initialization method, and the method of fixing the magnetization of the first magnetization fixed region 11a and the second magnetization fixed region 11b.

In the present exemplary embodiment, the first magnetization free layer 10 includes: the first magnetization fixed region 11a, the second magnetization fixed region 11b and the magnetization free region 12, and the magnetization of the first magnetization fixed region 11a and the magnetization of the second magnetization fixed region 11b are fixed such that they are anti-parallel to each other. Therefore, the initialization process is required for making the magnetization of the first magnetization fixed region 11a and the magnetization of the second magnetization fixed region 11b anti-parallel to each other. For performing the initialization process to fix the magnetization of the first magnetization fixed region 11a and the magnetization of the second magnetization fixed region 11b anti-parallel to each other, it is preferable that magnetization fixed layer 60 made of magnetically hard material is provided near the first magnetization fixed region 11a and the second magnetization fixed region 11b. In the example shown in FIGS. 1A to 1C, the step formation layer 50 and the magnetization fixed layer 60 are combined. However, the magnetization fixed layer 60 may be provided in addition to the step formation layer 50.

FIGS. 11A and 11B show an example that the magnetization fixed layer 60 is provided in addition to the step formation layer 50. That is, on the lower side of the first magnetization fixed region 11a and the second magnetization fixed region 11b, the first step formation layer 50a and the second step formation layer 50b are respectively provided. On the upper side of the first magnetization fixed region 11a and the second magnetization fixed region 11b, the first magnetization fixed layer 60a and the second magnetization fixed layer 60b are respectively provided. In this case, the step formation layer 50 is not required to be magnetic material, and is just required to be any material on which the appropriate step can be formed. In addition, it is preferable that the first magnetization fixed layer 60a and the second magnetization fixed layer 60b are magnetically hard ferromagnetic material with perpendicular magnetic anisotropy. Further, from the viewpoint of the initialization, for example, the first magnetization fixed layer 60a is magnetically harder than the second magnetization fixed layer 60b.

11-3. Third Modification Example

Figure 12A:
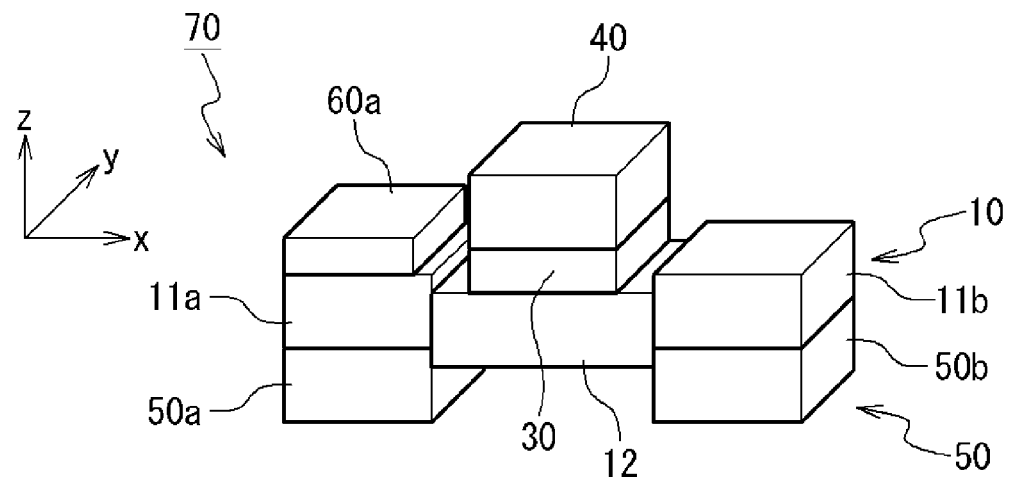
FIG. 12A schematically shows a structure of a third modification example of a magnetic memory element according to the first exemplary embodiment of the present invention.
Figure 12B:
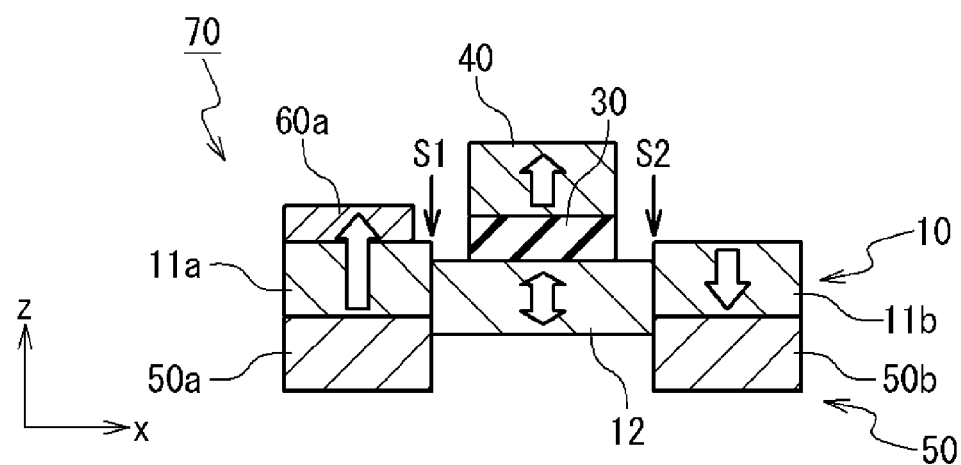
FIG. 12B schematically shows the structure of the third modification example of the magnetic memory element according to the first exemplary embodiment of the present invention.

FIGS. 12A and 12B schematically show structures of the third modification example of the magnetic memory element 70 according to the first exemplary embodiment of the present invention. FIG. 12A shows the perspective view and FIG. 12B shows the x-z sectional view. The third modification example relates to the number of the magnetization fixed layers 60.

In the present exemplary embodiment, it is preferable that the magnetization fixed layer 60 is provided for the initialization and the fixing of the magnetization directions of the first magnetization fixed region 11a and the second magnetization fixed region 11b. However, the number of the magnetization fixed layers 60 is arbitrary. That is, the drawings which have been shown above indicate the examples that two magnetization fixed layers 60 are provided. However, as shown in FIGS. 12A and 12B, one magnetization fixed layer 60 may be available. In FIGS. 12A and 12B, the first magnetization fixed layer 60a is provided on the upper portion of the first magnetization fixed region 11a, but a layer corresponding to the second magnetization fixed layer 60b in FIGS. 11A and 11B is not provided on the upper portion of the second magnetization fixed region 11b. In this case, also, the difference of the magnetic properties between the first magnetization fixed region 11a and the second magnetization fixed region 11b arises and the initialization for introducing a single domain wall into the magnetization free layer 10 can be performed.

In addition, FIGS. 12A and 12B show the example that the magnetization fixed layer 60 is provided on the upper portion of the magnetization free layer 10. However, the magnetization fixed layer 60 may be provided on the lower side of the magnetization free layer 10. For example, the first step formation layer 50a is provided on the lower side of the first magnetization fixed region 11a, the second step formation layer 50b is provided on the lower side of the second magnetization fixed region 11b, the first step formation layer 50a is composed of ferromagnetic material including a function as the magnetization fixed layer 60, and the second step formation layer 50b is composed of non-magnetic material (not shown).

11-4. Fourth Modification Example

Figure 13A:
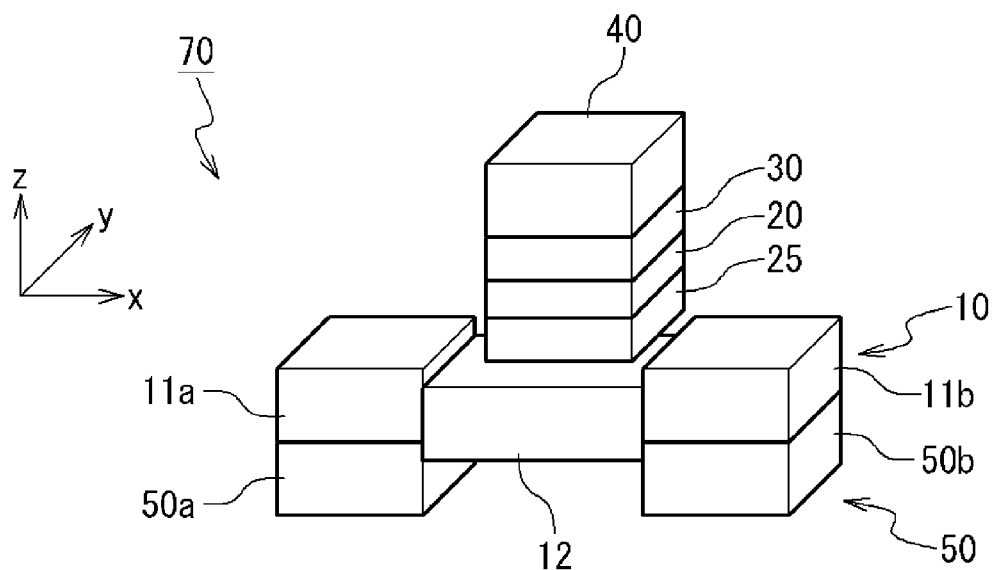
FIG. 13A schematically shows a structure of a fourth modification example of a magnetic memory element according to the first exemplary embodiment of the present invention.
Figure 13B:
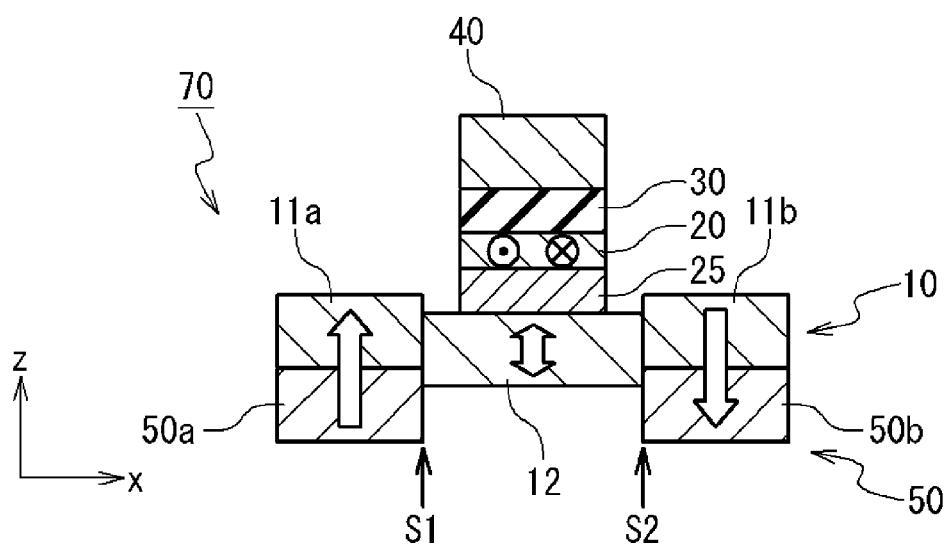
FIG. 13B schematically shows the structure of the fourth modification example of the magnetic memory element according to the first exemplary embodiment of the present invention.
Figure 13C:
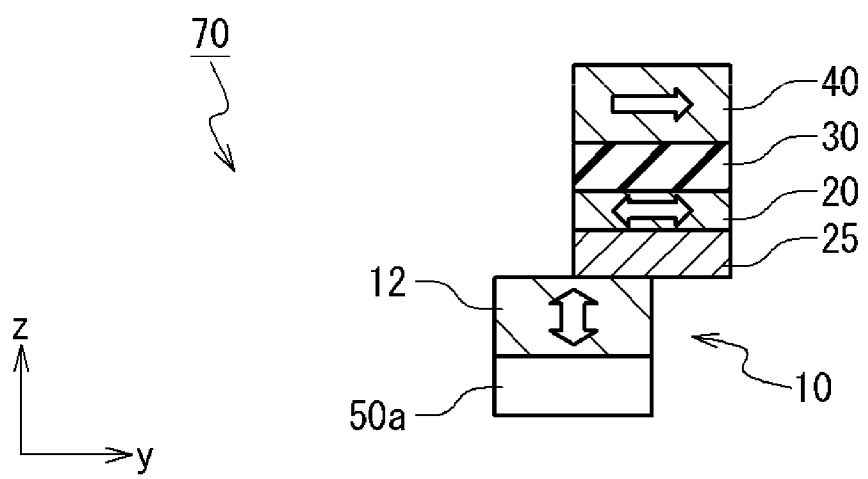
FIG. 13C schematically shows the structure of the fourth modification example of the magnetic memory element according to the first exemplary embodiment of the present invention.

FIGS. 13A to 13C schematically show structures of the fourth modification example of the magnetic memory element 70 according to the first exemplary embodiment of the present invention. FIG. 13A shows the perspective view, FIG. 13B shows the x-z sectional view, and FIG. 13C shows the z-y sectional view. The fourth modification example relates to the reading method.

In the present exemplary embodiment, to read information from the first magnetization free layer 10 as an information storage layer, the non-magnetic layer 30 and the reference layer 40 are provided. The foregoing description shows the case that the non-magnetic layer 30 and the reference layer 40 are provided adjacently to the first magnetization free layer 10. However, the fourth modification example relates to another reading configuration.

In the fourth modification example, a second magnetization free layer 20 is newly provided. In addition, a contact layer 25 is preferably provided. Further, the second magnetization free layer 20, the non-magnetic layer 30 and the reference layer 40 are adjacently provided in this order, thereby constituting the magnetic tunnel junction (MTJ).

Preferably, a position of a center of gravity of the second magnetization free layer 20 does not overlap with a position of a center of gravity of the magnetization free region 12 of the first magnetization free layer 10 in the x-y plane. Here, the direction from the one position to the other position is defined as a first direction. The second magnetization free layer 20 and the reference layer 40 are composed of ferromagnetic material having in-plane magnetic anisotropy. The direction of the in-plane magnetic anisotropy of the second magnetization free layer 20 is arbitrary in the plane. The magnetization of the reference layer 40 is substantially fixed in one direction. This direct ion is preferably parallel to the first direction. FIGS. 13A to 13C show an example that the first direction is the y direction, namely, is perpendicular to the longitudinal direction of the first magnetization free layer 10. Here, the first direction is arbitrary and may be parallel to, for example, the x direction.

According to the present modification example, the information stored as the magnetization direction with the perpendicular direction of the magnetization free region 12 can be read by using the MTJ composed of the second magnetization free layer 20, the non-magnetic layer 30 and the reference layer 40 with the in-plane magnetization. For example, in the "0" state in which the magnetization free region 12 is magnetized in the upper direction, the magnetization of the second magnetization free layer 20 is oriented to the y-axis positive direction (the +y direction) by the leakage magnetic flux generated by the magnetization with the upper direction of the magnetization free region 12. This is because the second magnetization free layer 20 is arranged on the upper side (the z-axis positive direction; the +z direction) of the magnetization free region 12, and the center of gravity of the second magnetization free layer 20 is shifted with respect to the center of gravity of the magnetization free region 12 in the y-axis positive direction (the +y direction). Therefore, the magnetization of the second magnetization free layer 20 and the magnetization of the reference layer 40 are parallel and the MTJ is in the low resistance state.

On the other hand, in the "1" state in which the magnetization free region 12 is magnetized in the lower direction, the magnetization of the second magnetization free layer 20 is oriented to the y-axis negative direction (the −y direction) by the leakage magnetic flux generated by the magnetization with the lower direction of the magnetization free region 12. Therefore, the magnetization of the second magnetization free layer 20 and the magnetization of the reference layer 40 are anti-parallel and the MTJ is in the high resistance state. As a result, the information stored as the magnetization with the perpendicular direction of the magnetization free region 12 is transmitted to the magnetization of the second magnetization free layer 20 with the in-plane magnetization, thereby enabling to be read by using the MTJ with the in-plane magnetization.

In the MTJ with the in-plane magnetization, the high magnetoresistive effect (the MR ration) can be generally obtained. Therefore, a large reading signal can be acquired.

The second magnetization free layer 20 and the reference layer 40 are composed of material with in-plane magnetic anisotropy. Specifically, Co—Fe—N and the like are exemplified. In addition, the non-magnetic layer 30 is preferably composed of non-magnetic material. Specifically, Mg—O and the like are exemplified.

Second Exemplary Embodiment

Figure 14A:
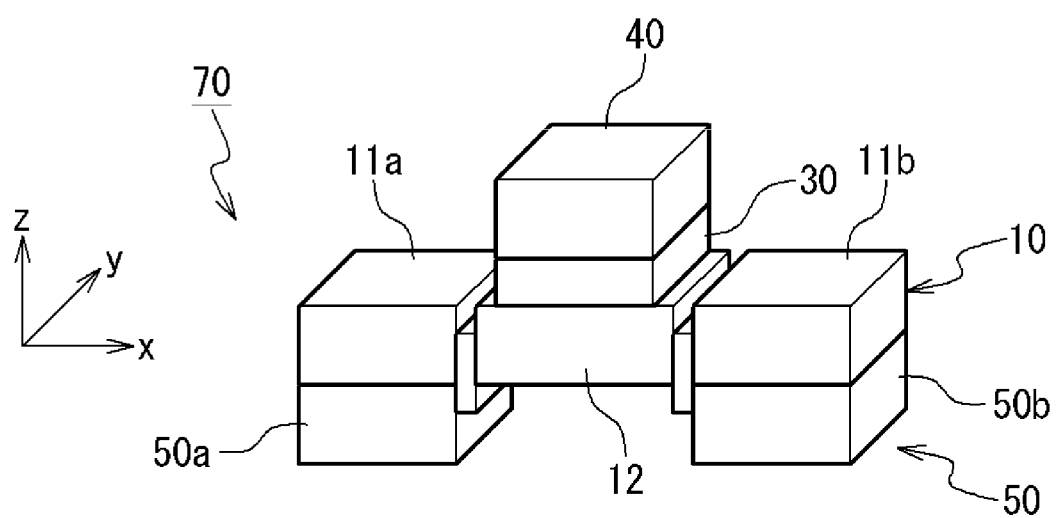
FIG. 14A schematically shows a typical structure of a main portion of a magnetic memory element according to a second exemplary embodiment of the present invention.
Figure 14B:
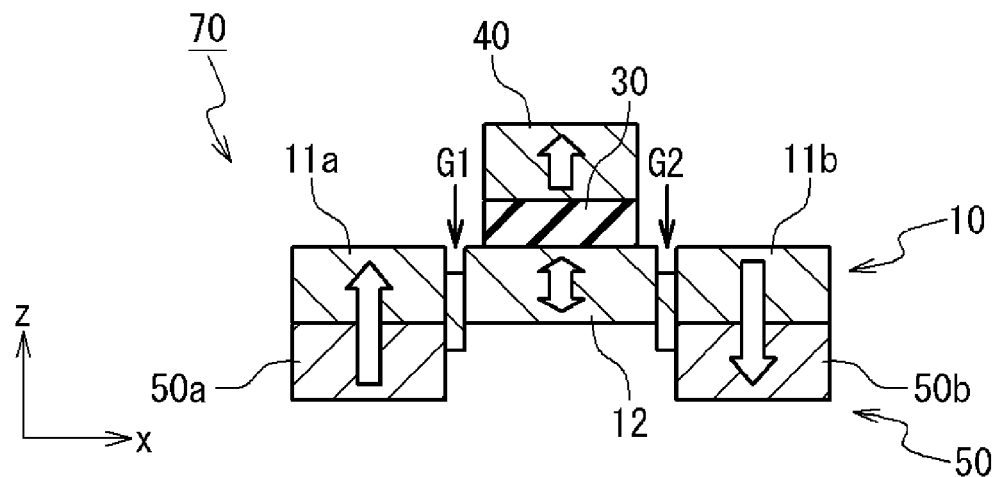
FIG. 14B schematically shows the typical structure of the main portion of the magnetic memory element according to the second exemplary embodiment of the present invention.
Figure 14C:
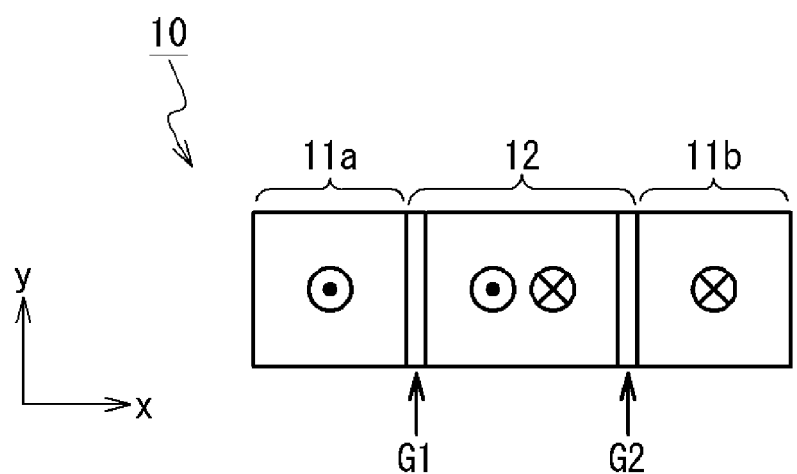
FIG. 14C schematically shows the typical structure of the main portion of the magnetic memory element according to the second exemplary embodiment of the present invention.

1. Structure, Memory State, Writing Method, Reading Method, Circuit Configuration, and Material FIGS. 14A to 14C schematically show typical structures of a main portion of the magnetic memory element 70 according to the second exemplary embodiment of the present invention. FIG. 14A shows the perspective view, FIG. 14B shows the x-z sectional view, and FIG. 14C shows the z-y plan view. Here, in the shown x-y-z coordinate system, the z axis indicates the direction perpendicular to the substrate. The x axis and the y axis are parallel to the surface of the substrate (substrate surface).

The magnetic memory element 70 according to the second exemplary embodiment of the present invention also includes the first magnetization free layer 10, the non-magnetic layer 30, the reference layer 40 and the step formation layer 50 as the basic elements similarly to the first exemplary embodiment. The structure and the magnetization structure of the first magnetization free layer 10, and, the lamination structure, the magnetization structure and the method connecting the external wiring lines of the first magnetization free layer 10, the non-magnetic 30 and the reference layer 40 of the second exemplary embodiment are the same as those of the first exemplary embodiment. Therefore, the descriptions thereof are omitted. In addition, in the second exemplary embodiment, the step formation layer 50 is also provided on the lower side of the first magnetization free layer 10. In the example shown in FIGS. 14A to 14C, the first step formation layer 50a is provided on the lower portion of the first magnetization fixed region 11a, and the second step formation layer 50b is provided on the lower portion of the second magnetization fixed region 11b.

In the second exemplary embodiment of the present invention, a groove or a protrusion is formed in the first magnetization free layer 10. In the example shown in FIGS. 14A to 14C, a groove G1 is formed at the boundary between the first magnetization fixed region 11a and the magnetization free region 12, and a groove G2 is formed at the boundary between the second magnetization fixed region 11b and the magnetization free region 12. In the present exemplary embodiment, as described above, the single domain wall is formed in the first magnetization free layer 10. The grooves G1 and G2 function as pinning sites.

In the second exemplary embodiment, also, there is no limitation for material which is used for the step formation layer 50. The material may be conductive material, insulating material, magnetic material and non-magnetic material. FIGS. 14A to 14C show the example that the step formation layer 50 is composed of ferromagnetic material with perpendicular magnetic anisotropy. FIGS. 14A to 14C show the example that the first step formation layer 50a and the second step formation layer 50b are magnetically coupled with the first magnetization fixed region 11a and the second magnetization fixed region 11b, respectively.

Since the memory states, the writing method, the reading method, the circuit configuration, the material and the effects are the same as those of the first exemplary embodiment, the descriptions thereof are omitted.

2. Manufacturing Method

Next, the method of manufacturing the magnetic memory element 70 according to the second exemplary embodiment of the present invention will be described below.

FIGS. 15A to 15H are sectional views schematically showing a flow of an example of the method of manufacturing the magnetic memory element 70 according to the second exemplary embodiment of the present invention.

Figure 15A:
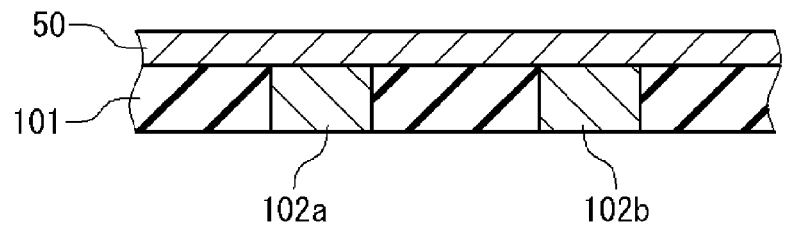
FIG. 15A is a sectional view schematically showing a flow of an example of a method of manufacturing the magnetic memory element according to the second exemplary embodiment of the present invention.
Figure 15B:
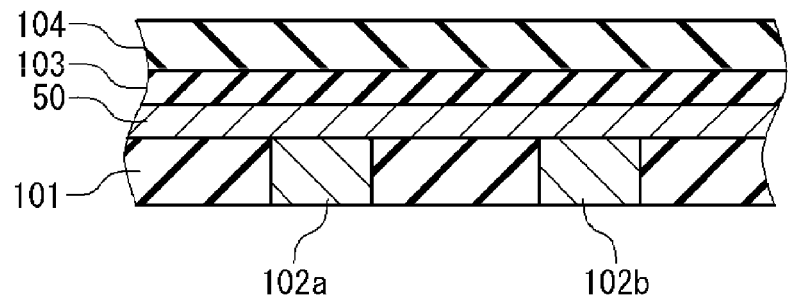
FIG. 15B is a sectional view schematically showing the flow of the example of the method of manufacturing the magnetic memory element according to the second exemplary embodiment of the present invention.
Figure 15C:
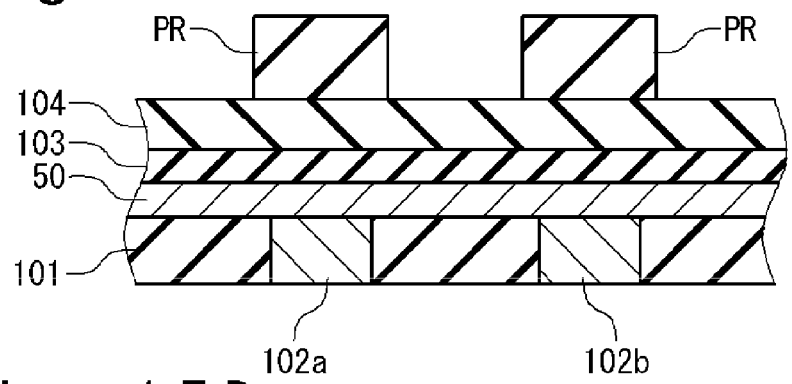
FIG. 15C is a sectional view schematically showing the flow of the example of the method of manufacturing the magnetic memory element according to the second exemplary embodiment of the present invention.
Figure 15D:
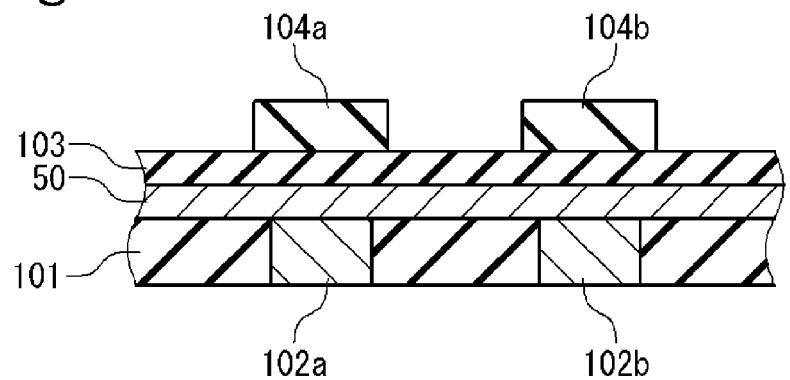
FIG. 15D is a sectional view schematically showing the flow of the example of the method of manufacturing the magnetic memory element according to the second exemplary embodiment of the present invention.
Figure 15E:
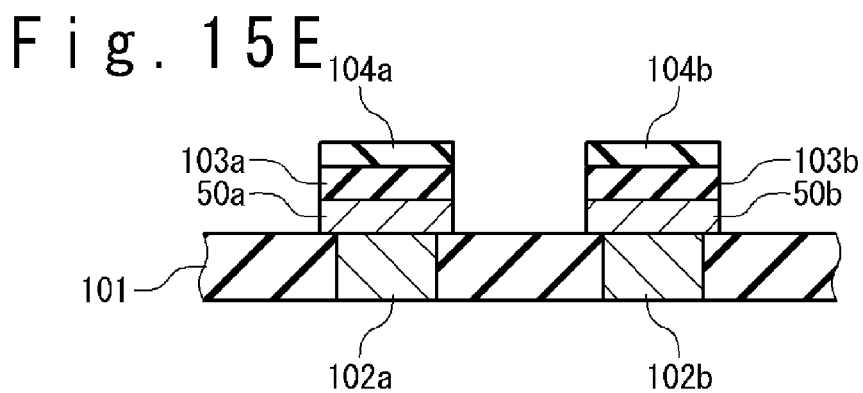
FIG. 15E is a sectional view schematically showing the flow of the example of the method of manufacturing the magnetic memory element according to the second exemplary embodiment of the present invention.
Figure 15F:
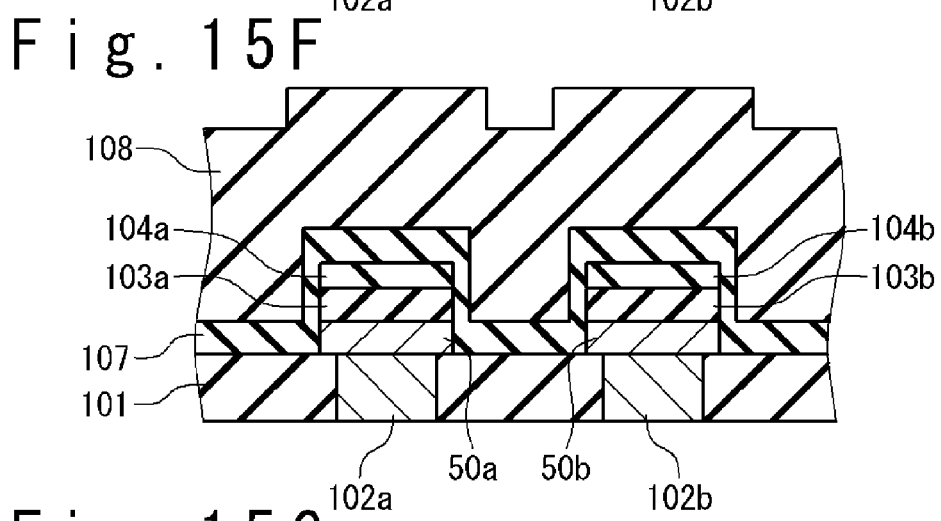
FIG. 15F is a sectional view schematically showing the flow of the example of the method of manufacturing the magnetic memory element according to the second exemplary embodiment of the present invention.
Figure 15G:
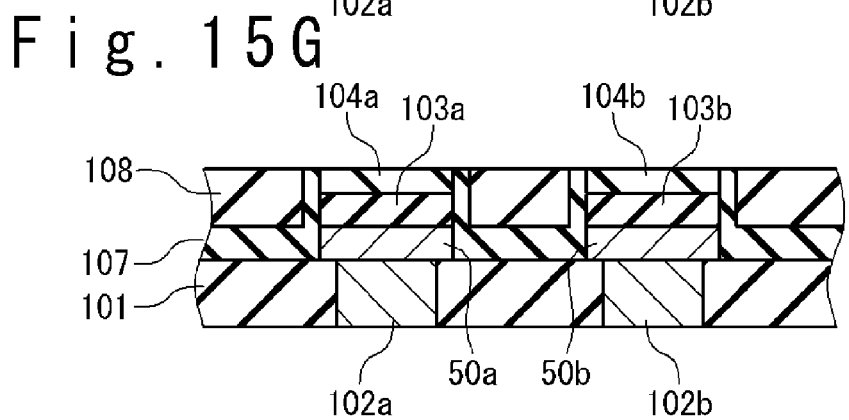
FIG. 15G is a sectional view schematically showing the flow of the example of the method of manufacturing the magnetic memory element according to the second exemplary embodiment of the present invention.
Figure 15H:
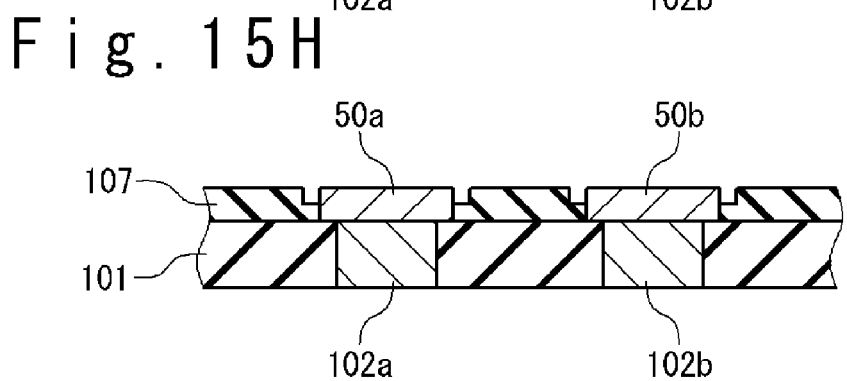
FIG. 15H is a sectional view schematically showing the flow of the example of the method of manufacturing the magnetic memory element according to the second exemplary embodiment of the present invention.

First, a step formation layer 50 is formed on a substrate where a first electrode 102a and a second electrode 102b are embedded in a first interlayer film 101. This situation is shown in FIG. 15A. Next, a first hard mask 103 and a second hard mask 104 are formed on the step formation layer 50. This situation is shown in FIG. 15B. Then, patterning of photoresist PR is performed by coating, exposing and developing the photoresist PR. This situation is shown in FIG. 15C. Next, etching of the second hard mask 104 is performed by using the patterned photoresist PR as a mask, followed by removing the photoresist PR. This situation is shown in FIG. 15D. Then, etching of the first hard mask 103 and the step formation layer 50 is performed by using the patterned second hard masks 104a and 104b. This situation is shown in FIG. 15E. After that, a cover film 107 and a third interlayer film 108 are formed such that the patterned second hard masks 104a and 104b, the patterned first hard masks 103a and 103b, the patterned step formation layers 50a and 50b and the first interlayer film 101 are covered with them. This situation is shown in FIG. 15F. Next, planarization is performed by using the CMP processing. This situation is shown in FIG. 15G. Here, FIG. 15G shows a case that a protrusion portion of the third interlayer film 108 is removed by the CMP processing. Finally, an etching-back process of the whole area is performed. In this case, when etching rate of the cover film 107 is larger than etching rates of the step formation layer 50 and the third interlayer film 108, grooves are formed at the edges of the step formation layers. This situation is shown in FIG. 15H. By forming the first magnetization free layer 10, the non-magnetic layer 30 and the reference layer 40 on the structure shown in FIG. 15H and performing appropriate patterning, the magnetic memory element 70 is formed. The methods of forming the first magnetization free layer 10, the non-magnetic layer 30 and the reference layer 40 are arbitrary.

One of the characteristics of the second exemplary embodiment of the present invention is that the groove is formed on the substrate surface where the first magnetization free layer 10 is formed. As described in FIGS. 15A to 15H, this groove is formed by using the etching rate difference between the cover film 107 surrounded the step formation layer 50 and the interlayer film 108/the step formation layer 50. Such etching rate difference can be easily designed based on material, a deposition method and an etching method to be used.

In addition, in the manufacturing method shown in FIGS. 15A to 15H, a rectangular feature in the etching process for the step formation layer 50 shown in FIG. 15E is reflected to a rectangular feature of the step. Therefore, in this etching process, by performing the etching using the reactive ion etching (RIE) method and so on such that the rectangular feature becomes stronger, the groove which has higher rectangular feature can be formed. In addition, the thickness of the side wall portion of the cover film 107 shown in the process of FIG. 15F is reflected to the width of the groove. Therefore, the groove with an arbitrary width can be formed by appropriately controlling the thickness of the side wall of the cover film 107 in the process.

3. Example

Next, a result (an example) of which the second exemplary embodiment of the present invention is implemented will be described.

Figure 16:
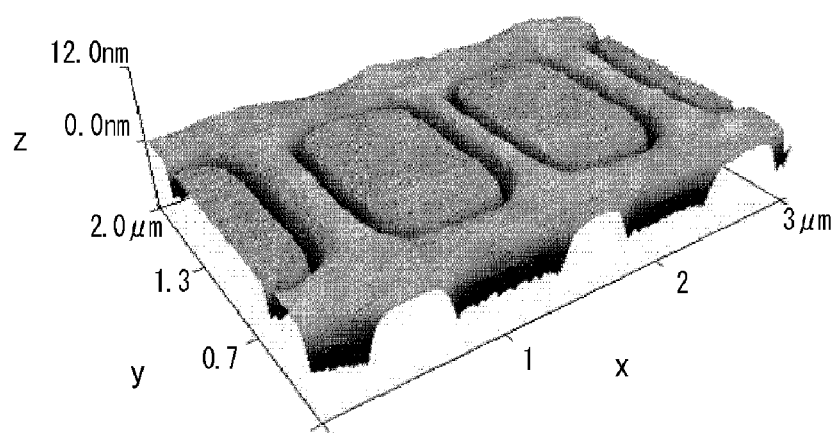
FIG. 16 shows a result of AFM observation of a substrate surface with a groove which is manufactured by a manufacturing method shown in FIGS. 15A to 15H.

FIG. 16 shows a result of AFM observation of the substrate surface with the groove which is manufactured by the manufacturing method shown in FIGS. 15A to 15H. To manufacture the domain wall motion MRAM, the first magnetization layer 10 is deposited on this surface.

Here, in the manufacturing method shown in FIGS. 15A to 15H, Ta (30 nm) is used for the step formation layer 50, Si—N (30 nm) is used for the first hard mask 103, Si—O (40 nm) is used for the second hard mask 104, Si—N (30 nm) is used for the cover film 107, and Si—O (250 nm) is used for the third interlayer film 108. In addition, $CF_4$ series gas and $Cl_2$ series gas are used in the etching process in FIG. 15E, silica series slurry is used in the CMP process in FIG. 15G, and an Ar series ion beam etching method is used in the etching back process in FIG. 15H. From the AFM observation, it is found that the groove with the depth of approximately 5 to 10 nm can be formed. When the SEM observation for the cross section is performed, it is confirmed that the very precipitous step in which a taper angle at the step portion is approximately 80 degrees is formed.

4. Modification Example

Figure 17A:
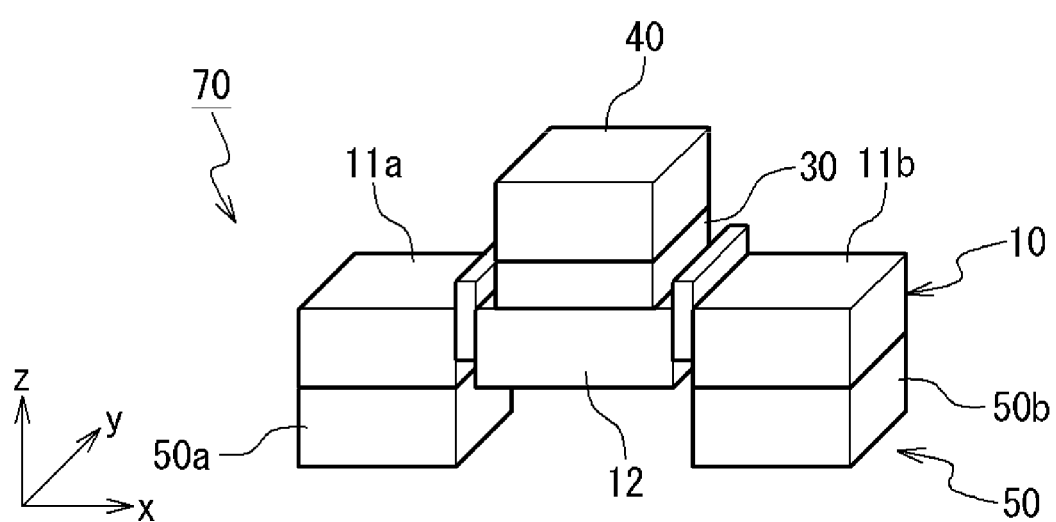
FIG. 17A schematically shows a structure of a modification example of a magnetic memory element according to the second exemplary embodiment of the present invention.
Figure 17B:
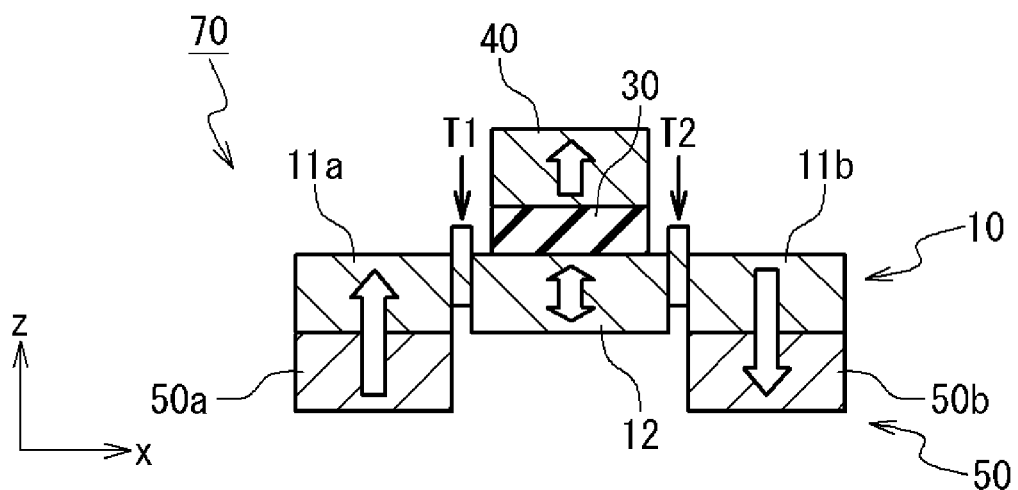
FIG. 17B schematically shows the structure of the modification example of the magnetic memory element according to the second exemplary embodiment of the present invention.
Figure 17C:
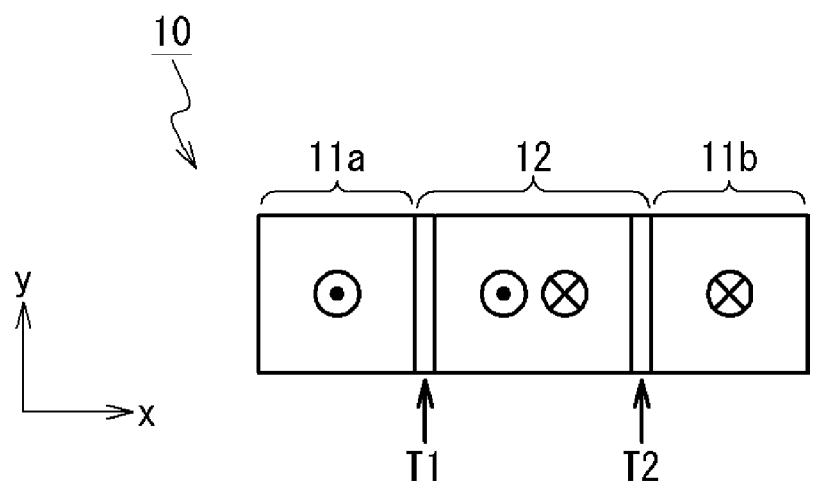
FIG. 17C schematically shows the structure of the modification example of the magnetic memory element according to the second exemplary embodiment of the present invention.

FIGS. 17A to 17C schematically show structures of the modification example of the magnetic memory element 70 according to the second exemplary embodiment of the present invention. FIG. 17A shows the perspective view, FIG. 17B shows the x-z sectional view, and FIG. 17C shows the x-y plan view. The modification example relates to a variation of the groove G1 in FIGS. 14A to 14C.

In the second exemplary embodiment of the present invention, the pinning sites of the first magnetization free layer 10 are formed at the boundary between the first magnetization fixed region 11a and the magnetization free region 12 and the boundary between the second magnetization fixed region 11b and the magnetization free region 12. FIGS. 14A to 14C show the specific example of the grooves G1 and G2. However, as shown in FIGS. 17A to 17C, the protrusions may be formed instead of the grooves. FIGS. 17A to 17C show an example that the protrusions T1 and $T_2$ are formed at the boundary between the first magnetization fixed region 11a and the magnetization free region 12 and the boundary between the second magnetization fixed region 11b and the magnetization free region 12.

Such a protrusion can be formed by designing that the etching rate of the cover film 107 is smaller than the etching rates of other layers in FIGS. 15A to 15H.

The whole or part of the exemplary embodiments disclosed above can be described as, but not limited to, the following supplementary notes.

(Supplementary Note 1)

A magnetic memory element including:
a first magnetization free layer configured to be composed of ferromagnetic material with perpendicular magnetic anisotropy;
a reference layer configured to be provided near the first magnetization free layer;
a non-magnetic layer configured to be provided adjacent to the reference layer; and
a step formation layer configured to be provided under the first magnetization free layer,
wherein the first magnetization free layer includes:
a first magnetization fixed region of which magnetization is fixed,
a second magnetization fixed region of which magnetization is fixed, and
a magnetization free region configured to be connected with the first magnetization fixed region and the second magnetization fixed region,
wherein the first magnetization free layer has at least one of a step, a groove and a protrusion inside.

(Supplementary Note 2)

The magnetic memory element according to supplementary note 1, wherein the step formation layer includes:
a first step formation layer, and
a second step formation layer,
wherein the first step formation layer is provided on a lower side of the first magnetization fixed region, and
wherein the second step formation layer is provided on a lower side of the second magnetization fixed region.

(Supplementary Note 3)

The magnetic memory element according to supplementary note 2, further including:
a magnetization fixed layer configured to be provided near at least one of the first magnetization fixed region and the second magnetization fixed region,
wherein the magnetization fixed layer is composed of ferromagnetic material.

(Supplementary Note 4)

The magnetic memory element according to supplementary note 3, wherein the step formation layer is combined with the magnetization fixed layer.

(Supplementary Note 5)

The magnetic memory element according to supplementary note 3, wherein the magnetization fixed layer is provided at a side opposite to a substrate with respect to the first magnetization free layer.

(Supplementary Note 6)

The magnetic memory element according to any of supplementary notes 1 to 5, wherein the non-magnetic layer is provided adjacently to the magnetization free region,
wherein the reference layer is provided adjacently to the non-magnetic layer and oppositely to the magnetization free region with respect to the non-magnetic layer, and
wherein the reference layer is composed of ferromagnetic material with perpendicular magnetic anisotropy.

(Supplementary Note 7)

The magnetic memory element according to any of supplementary notes 1 to 5, further including:
a second magnetization free layer,
wherein the non-magnetic layer is provided adjacently to the second magnetization free layer,
wherein the reference layer is provided adjacently to the non-magnetic layer and oppositely to the second magnetization free layer with respect to the non-magnetic layer,
wherein the second magnetization free layer is provided so as to be shifted with respect to the magnetization free region in a first direction in a plane parallel to a substrate,
wherein the second magnetization free layer and the reference layer are composed of ferromagnetic material with perpendicular magnetic anisotropy, and
wherein the reference layer has magnetization fixed in a direction approximately parallel to the first direction.

(Supplementary Note 8)
The magnetic memory element according to any of supplementary notes 1 to 7, wherein the step formation layer contains Ti, V, Cr, Zr, Nb, Mo, Hf, Ta, or W.

(Supplementary Note 9)
A magnetic memory including:
a plurality of magnetic memory elements according to any of supplementary notes 1 to 8, configured to be arranged in a matrix shape.

(Supplementary Note 10)
A manufacturing method of a magnetic memory, in which the magnetic memory includes a plurality of magnetic memory elements according to any of supplementary notes 1 to 8, configured to be arranged in a matrix shape, including:
forming a step formation film;
forming a step formation layer by patterning the step formation film;
forming an insulation film on the step formation layer;
forming an insulation layer which has a step or a groove between the step formation layer and the insulation layer by performing a CMP process and an etching back process to the insulation film in this order; and
forming a non-magnetic layer and a reference layer on the insulation layer.

(Supplementary Note 11)
The manufacturing method of a magnetic memory according to supplementary note 10, wherein an RIE method is used for patterning the step formation film.

While the invention has been particularly shown and described with reference to exemplary embodiments, examples and modification examples thereof, the invention is not limited to these exemplary embodiments, examples and modification examples. It will be understood by those of ordinary skill in the art that various changes in form and details may be made therein without departing from the spirit and scope of the present invention as defined by the claims. In addition, the content described in each of the exemplary embodiments, examples and modification examples may be applied to any of the exemplary embodiments, examples and modification examples by the combination and/or replacement manner, if technical contradiction does not occur.

The invention claimed is:

1. A magnetic memory element comprising:
a first magnetization free layer configured to be composed of ferromagnetic material with perpendicular magnetic anisotropy;
a reference layer configured to be provided near the first magnetization free layer:
a non-magnetic configured to be provided adjacent to the reference layer; and
a step formation layer configured to be provided under the first magnetization free layer,
wherein the first magnetization free layer includes:
a first magnetization fixed region of which magnetization is fixed,
a second magnetization fixed region of which magnetization is fixed, and
a magnetization free region configured to be connected with the first magnetization fixed region and the second magnetization fixed region,
wherein the first magnetization free layer has at least one of a step, a groove and a protrusion inside,
wherein the step formation layer includes:
a first step formation layer, and
a second step formation layer,
wherein the first step formation layer is provided on a lower side of the first magnetization fixed region, and
wherein the second step formation layer is provided on a lower side of the second magnetization fixed region.

2. The magnetic memory element according to claim 1, further comprising:
a magnetization fixed layer configured to be provided near at least one of the first magnetization fixed region and the second magnetization fixed region,
wherein the magnetization fixed layer is composed of ferromagnetic material.

3. The magnetic memory element according to claim 2, wherein the step formation layer is combined with the magnetization fixed layer.

4. The magnetic memory element according to claim 2, wherein the magnetization fixed layer is provided at a side opposite to a substrate with respect to the first magnetization free layer.

5. The magnetic memory element according to claim 1, wherein the non-magnetic layer is provided adjacently to the magnetization free region,
wherein the reference layer is provided adjacently to the non-magnetic layer and oppositely to the magnetization free region with respect to the non-magnetic layer, and
wherein the reference layer is composed of ferromagnetic material with perpendicular magnetic anisotropy.

6. A magnetic memory element comprising:
a first magnetization free layer configured to be composed of ferromagnetic material with perpendicular magnetic anisotropy;
a reference layer configured to be provided near the first magnetization free layer;
a non-magnetic layer configured to be provided adjacent to the reference layer; and
a step formation layer configured to be provided under the first magnetization free layer,
a second magnetization free layer,
wherein the first magnetization free layer includes:
a first magnetization fixed region of which magnetization is fixed,
a second magnetization fixed region of which magnetization is fixed, and
a magnetization free region configured to be connected with the first magnetization fixed region and the second magnetization fixed region,
wherein the first magnetization free layer has at least one of a step, a groove and a protrusion inside,
wherein the non-magnetic layer is provided adjacently to the second magnetization free layer,
wherein the reference layer is provided adjacently to the non-magnetic layer and oppositely to the second magnetization free layer with respect to the non-magnetic layer,
wherein the second magnetization free layer is provided so as to be shifted with respect to the magnetization free region in a first direction in a plane parallel to a substrate,
wherein the second magnetization free layer and the reference layer are composed of ferromagnetic material with perpendicular magnetic anisotropy, and
wherein the reference layer has magnetization fixed in a direction approximately parallel to the first direction.

7. A manufacturing method of a magnetic memory, in which the magnetic memory includes a plurality of magnetic memory configured to be arranged in a matrix shape,
wherein the magnetic memory element includes:
a first magnetization free layer configured to be composed of ferromagnetic material with perpendicular magnetic anisotropy, a reference layer configured to be provided near the first magnetization free layer, a non-magnetic layer configured to be provided adjacent to the reference layer, and a step formation layer configured to be provided under the first magnetization free layer, wherein the first magnetization free layer includes:
a first magnetization fixed region of which magnetization is fixed,
a second magnetization fixed region of which magnetization is fixed, and
a magnetization free region configured to be connected with the first magnetization fixed region and the second magnetization fixed region,
wherein the first magnetization free layer has at least one of a step, a groove and a protrusion inside,
the manufacturing method comprising:
forming a step formation film;
forming a step formation layer by patterning the step formation film;
forming an insulation film on the step formation layer;
forming an insulation layer which has a step or a groove between the step formation layer and the insulation layer by performing a CMP process and an etching back process to the insulation film in this order; and
forming a first magnetization free layer, a non-magnetic layer and a reference layer in this order on the insulation layer.

8. The manufacturing method of a magnetic memory according to claim 7, wherein an RIE method is used for patterning the step formation film.

9. A magnetic memory comprising:
a plurality of magnetic memory elements configured to be arranged in a matrix shape,
wherein the magnetic memory element includes:
a first magnetization free layer configured to be composed of ferromagnetic material with perpendicular magnetic anisotropy,
a reference layer configured to be provided near the first magnetization free layer,
a non-magnetic layer configured to be provided adjacent to the reference layer, and
a step formation layer configured to be provided under the first magnetization free layer,
wherein the first magnetization free layer includes:
a first magnetization fixed region of which magnetization is fixed,
a second magnetization fixed region of which magnetization is fixed, and
a magnetization free region configured to be connected with the first magnetization fixed region and the second magnetization fixed region,
wherein the first magnetization free layer has at least one of a step, a groove and a protrusion inside,
wherein the step formation layer includes:
a first step formation layer, and
a second step formation layer,
wherein the first step formation layer is provided on a lower side of the first magnetization fixed region, and
wherein the second step formation layer is provided on a lower side of the second magnetization fixed region.

10. The magnetic memory according to claim 9, wherein the magnetic memory element further includes:
a magnetization fixed layer configured to be provided near at least one of the first magnetization fixed region and the second magnetization fixed region,
wherein the magnetization fixed layer is composed of ferromagnetic material.

11. The magnetic memory according to claim 10, wherein the step formation layer is combined with the magnetization fixed layer.

12. The magnetic memory according to claim 10, wherein the magnetization fixed layer is provided at a side opposite to a substrate with respect to the first magnetization free layer.

13. The magnetic memory according to claim 9, wherein the non-magnetic layer is provided adjacently to the magnetization free region,
wherein the reference layer is provided adjacently to the non-magnetic layer and oppositely to the magnetization free region with respect to the non-magnetic layer, and
wherein the reference layer is composed of ferromagnetic material with perpendicular magnetic anisotropy.

14. A magnetic memory comprising:
a plurality of magnetic memory elements configured to be arranged in a matrix shape,
wherein the magnetic memory element includes:
a first magnetization free layer configured to be composed of ferromagnetic material with perpendicular magnetic anisotropy,
a reference layer configured to be provided near the first magnetization free layer,
a non-magnetic layer configured to be provided adjacent to the reference layer, and
a step formation layer configured to be provided under the first magnetization free layer,
a second magnetization free layer,
wherein the first magnetization free layer includes:
a first magnetization fixed region of which magnetization is fixed,
a second magnetization fixed region of which magnetization is fixed, and
a magnetization free region configured to be connected with the first magnetization fixed region and the second magnetization fixed region,
wherein the first magnetization free layer has at least one of a step, a groove and a protrusion inside,
wherein the non-magnetic layer is provided adjacently to the second magnetization free layer,
wherein the reference layer is provided adjacently to the non-magnetic layer and oppositely to the second magnetization free layer with respect to the non-magnetic layer,
wherein the second magnetization free layer is provided so as to be shifted with respect to the magnetization free region in a first direction in a plane parallel to a substrate,
wherein the second magnetization free layer and the reference layer are composed of ferromagnetic material with perpendicular magnetic anisotropy, and
wherein the reference layer has magnetization fixed in a direction approximately parallel to the first direction.

15. A magnetic memory element comprising:
a first magnetization free layer configured to be composed of ferromagnetic material with perpendicular magnetic anisotropy;
a reference layer configured to be provided near the first magnetization free layer;
a non-magnetic layer configured to be provided adjacent to the reference layer; and
a step formation layer configured to be provided under the first magnetization free layer,
wherein the first magnetization free layer includes:
a first magnetization fixed region of which magnetization is fixed, a second magnetization fixed region of which magnetization is fixed, and a magnetization free region configured to be connected with the first magnetization fixed region and the second magnetization fixed region, wherein the first magnetization free layer has at least one of a step, a groove and a protrusion inside, wherein the step formation layer contains one of Ti, V, Cr, Zr, Nb, Mo, Hf, Ta, and W.

* * * * *